(12) United States Patent
Ballou et al.

(10) Patent No.: US 11,143,800 B2
(45) Date of Patent: Oct. 12, 2021

(54) EXTENDING THE REFLECTION BANDWITH OF SILVER COATING STACKS FOR HIGHLY REFLECTIVE MIRRORS

(71) Applicant: Corning Incorporated, Corning, NY (US)

(72) Inventors: Jason Scott Ballou, Gilsum, NH (US); Gary Allen Hart, Walworth, NY (US); Leonard Gerard Wamboldt, Sunderland, MA (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/001,280

(22) Filed: Jun. 6, 2018

(65) Prior Publication Data

US 2018/0364402 A1  Dec. 20, 2018

Related U.S. Application Data

(60) Provisional application No. 62/520,833, filed on Jun. 16, 2017.

(51) Int. Cl.
*G02B 5/28* (2006.01)
*G02B 5/08* (2006.01)
(Continued)

(52) U.S. Cl.
CPC .......... *G02B 5/0858* (2013.01); *C23C 14/025* (2013.01); *C23C 14/16* (2013.01);
(Continued)

(58) Field of Classification Search
CPC .......... G02B 5/00; G02B 5/08; G02B 5/0808; G02B 5/0816; G02B 5/0825;
(Continued)

(56) References Cited

U.S. PATENT DOCUMENTS 5,548,440 A   8/1996  Hohenegger et al.
5,851,365 A  12/1998  Scobey
(Continued)

FOREIGN PATENT DOCUMENTS

| DE | 102015102496 A1 | 4/2016 |
| DE | 102015103494 A1 | 9/2016 |
| WO | 2016054126 A1 | 4/2016 |

OTHER PUBLICATIONS

Feng et al; "Ab Initio Study of Ag/Al2O3 and Au/Al2O3 Interfaces"; Physical Review B, 72, 115423, Sep. 21, 2005.
(Continued)

*Primary Examiner* — Thong Q Nguyen
(74) *Attorney, Agent, or Firm* — Amy T. Lang; John P. McGroarty

(57) ABSTRACT

A highly reflective mirror for use in the wavelength range of 0.300 μm to 15 μm includes a substrate, a first interface layer, a reflective layer, a second interface layer, a plurality of tuning layers including a combination of a low index material and a high index material wherein the high index material is $HfO_2$, and a protective layer. The highly reflective mirror has a reflectivity of at least 90% over the wavelength range of 335 nm to 1000 nm at an angle of incidence (AOI) of 45°.

20 Claims, 11 Drawing Sheets

(51) Int. Cl.
*C23C 14/02* (2006.01)
*C23C 14/16* (2006.01)

(52) U.S. Cl.
CPC ......... *G02B 5/0808* (2013.01); *G02B 5/0816* (2013.01); *G02B 5/0875* (2013.01)

(58) Field of Classification Search
CPC .... G02B 5/0833; G02B 5/085; G02B 5/0858; G23C 14/025; G23C 14/16
USPC ................................ 359/350–361, 584–588
See application file for complete search history.

(56) References Cited

U.S. PATENT DOCUMENTS

| | | | |
|---|---|---|---|
| 6,128,126 | A | 10/2000 | Hohenegger et al. |
| 6,275,332 | B1 | 8/2001 | Hohenegger et al. |
| 6,310,905 | B1* | 10/2001 | Shirai ................. G02B 5/0891 359/360 |
| 6,695,458 | B2 | 2/2004 | Ohgane et al. |
| 7,242,843 | B2 | 7/2007 | Clar et al. |
| 7,838,134 | B2 | 11/2010 | Wolfe |
| 9,488,760 | B2 | 11/2016 | Ballou et al. |
| 9,971,073 | B2 | 5/2018 | Crifasi et al. |
| 9,995,860 | B2* | 6/2018 | Ballou ..................... G02B 1/14 |
| 2004/0150883 | A1* | 8/2004 | Shimoda ................ G03B 21/60 359/443 |
| 2006/0141272 | A1* | 6/2006 | Wolfe ................... G02B 5/0858 428/457 |
| 2006/0285208 | A1* | 12/2006 | Huang .................. G02B 5/282 359/559 |
| 2007/0081228 | A1* | 4/2007 | Hartig ................ C03C 17/3639 359/359 |
| 2007/0243355 | A1* | 10/2007 | Scott ................... C03C 17/3694 428/98 |
| 2011/0096391 | A1* | 4/2011 | Kanai ..................... F24S 23/82 359/360 |
| 2012/0128954 | A1* | 5/2012 | Ballou ................ C23C 14/0641 428/216 |
| 2013/0128342 | A1* | 5/2013 | Mitarai .................. B32B 17/10 359/359 |
| 2014/0016204 | A1* | 1/2014 | Hakuta .................. G02B 1/118 359/601 |
| 2014/0240821 | A1* | 8/2014 | Ballou ................. G02B 5/0858 359/360 |
| 2015/0285958 | A1* | 10/2015 | Comstock, II ....... G02B 5/0808 359/871 |
| 2016/0002099 | A1* | 1/2016 | Manz ................ B32B 17/10431 428/212 |
| 2016/0097885 | A1 | 4/2016 | Comstock, II et al. |
| 2017/0139085 | A1* | 5/2017 | Schurmann .......... G02B 5/0808 |

OTHER PUBLICATIONS

Graedel et al; "Corrosion Mechanisms for Silver Exposed to the Atmosphere"; J. Electrochemical Society, vol. 139, No. 7, pp. 1963-1969 (1992).

Hwangbo et al; "Ion Assisted Deposition of Thermally Evaoprated Ag and Al Films", Applied Optics vol. 28, No. 14, Jul. 15, 1989; pp. 2769-2778.

Kovalenko et al; "Thickness Dependences of Optical Constants for Thin Layers of Some Metals and Semiconductors,"; Semiconductor Physics, Quantum Electronics and Optoelectronics vol. 4, No. 4, pp. 352-357 (2001).

Liang et al; "Effects of Sodium Chloride Particles, Ozone, UV, and Relative Humidity on Atmospheric Corrosion of Silver"; J. Electrochemical Society vol. 157, No. 4, pp. C146-C156 (2010)).

Sheikh; "Improved Silver Mirror Coating for Ground and Space-Based Astronomy"; Proc. SPIE; vol. 9912 pp. 991239-1-991239-7; (2006).

Thomas et al; "Protected Silver Coating for Flashlamp-Pumped Nd:Glass Amplifiers"; 30th Annual Symposium on Optical Materials for High Power Lasers; Boulder, Colo. Sep. 30-Oct. 2, 1998 Preprint From Lawrence Livermore Laboratories; 9 Pages; (UCRL-JC-135179).

Thomas et al; "UV-Shifted Durable Silver Coating for Astronomical Mirrors"; Proc. of SPIE; vol. 4003 (2000) pp. 312-323.

Zhang et al; "Nonstoichiometric Interfaces and Al2O3 Adhesion With Al and Ag"; Physical Review Letters, vol. 85, No. 15, Oct. 9, 2000, pp. 3225-3228.

\* cited by examiner

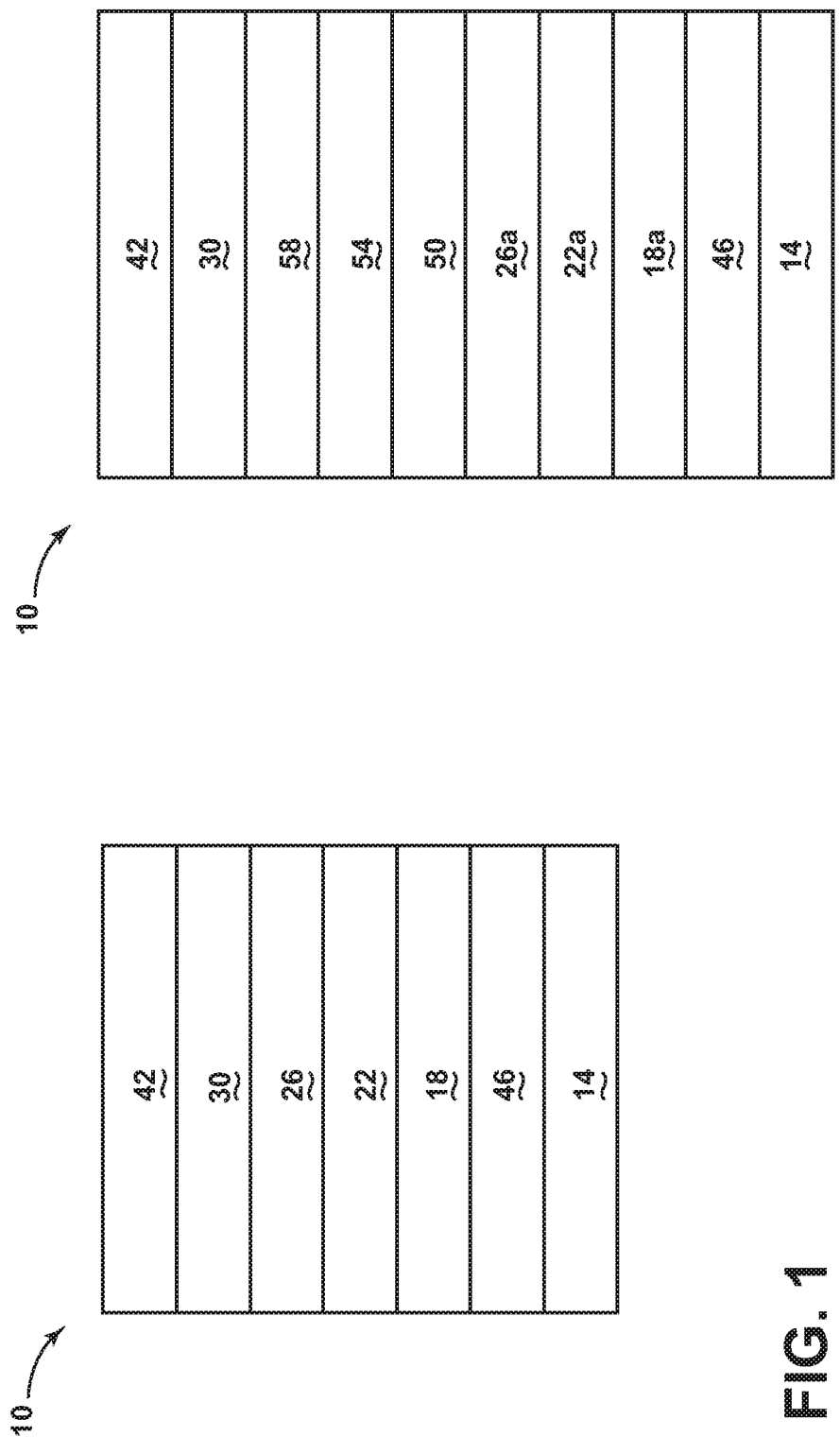

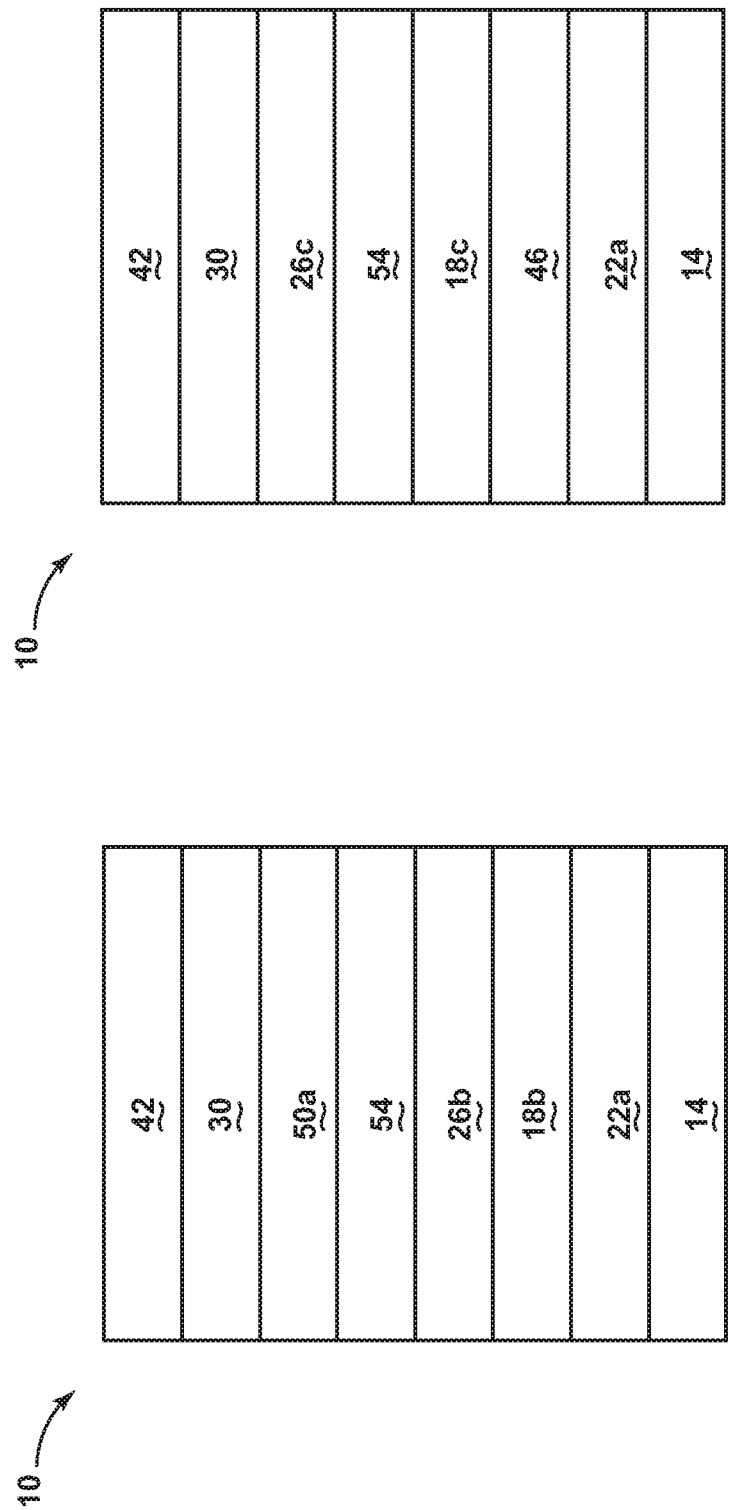

EXTENDING THE REFLECTION BANDWITH OF SILVER COATING STACKS FOR HIGHLY REFLECTIVE MIRRORS

This application claims the benefit of priority to U.S. Provisional Application Ser. No. 62/520,833 filed on Jun. 16, 2017, the content of which is relied upon and incorporated herein by reference in its entirety.

FIELD

The disclosure is directed to Enhanced, Durable Innovative Silver-containing ("EDIS") coating stacks for highly reflective mirrors having an extended reflection bandwidth, and to a method of making such stacks, that may be useful in ISR detectors.

BACKGROUND

There have been constant improvements in Intelligence-Surveillance-Reconnaissance (ISR) detector technology, for example, increasing the wavelength detection range, decreasing detector footprint, and reducing pixel size, all of which enable the system size and weight to be reduced. These improvements created an increased demand for ISR broad-multi-band optical systems; specifically including a high definition visible band (VIS, 0.34 µm to ~0.75 µm) as well as the near infrared (NIR, 0.75 µm to 1.4 µm), the short wavelength infrared (SWIR, 1.4 µm to 3 µm), the mid-wavelength infrared (MWIR, 3 µm to 8 µm), and long wavelength infrared (LWIR, 8 µm to 15 µm) bands. A key component of such systems is the reflective optics that has a silver coating thereon which enables the systems to achieve this spectral performance. While silver coatings on reflective optics have been critical to enabling these optical systems to achieve this wide-ranging spectral performance, silver's reflectivity is limited in the NUV region and the silver may also possess absorption bands in the LWIR. Historically however, silver coatings used in ISR detector technologies have been a source of system failures due to the propensity of the silver coating to "break-down" or "corrode" over time. It is thus desirable to have a broad band silver coated optic that is both durable in hot, humid, and salty environments while also providing high reflectance in the NUV and LWIR bands.

There are several test procedures that are used to evaluate the durability performance of thin film coated optical components. Examples include military specification documents such as MIL-C-48497, MIL-F-48616 and MIL-PRF-13830B, which include tests that involve exposure to humidity, salt fog, salt solutions, temperature cycling, abrasion, and other test procedures. The harshest of these tests is the "24-hour salt fog" test. The Quantum/Denton silver coating referred to as "X-1 Silver" demonstrates performance in the 0.4 µm to 0.7 µm range (See 2000 Society of Vacuum, Coaters 505/856-7188; 43$^{rd}$ Annual Technical Conference Proceedings (2000) ISSN 0737-5921), with no information provided for longer wavelengths into the infrared out to the LWIR range for this coating. While substrate heating might further improve performance, substrate heating is not desirable when using some metallic substrates, for example 6061-Al substrates, because if the temperature is too high the mechanical strength and corrosion resistance of the substrate is decreased. Consequently, it is preferred that the substrate temperature be below the heat treating (~415° C.) and stress relief (~350° C.) temperatures of the 6061-Al substrates. Lawrence Livermore Laboratories, U.S. Pat. No. 7,838,134, claims the use of nitrides for the silver adhesion-interface layers while using a $Si_3N_4$ protective cap layer where the "silver mirror is characterized by high reflectance in a broad spectral range of 300 nm in the UV to the far infrared (~10000 nm)", this range being 0.3 µm to 10 µm.

Accordingly, despite the advances made in the art, the need for durable silver mirrors having improved reflectance properties in the NUV and LWIR ranges is highly desirable.

SUMMARY

According to some embodiments, a highly reflective mirror for use in the wavelength range of 0.300 µm to 15 µm is provided. The mirror includes a substrate, a first interface layer, a reflective layer, a second interface layer, a plurality of tuning layers including a combination of a low index material and a high index material wherein the high index material is $HfO_2$, and a protective layer. The highly reflective mirror has a reflectivity of at least 90% over the wavelength range of 335 nm to 1000 nm at an AOI 45°.

According to other embodiments, a highly reflective mirror for use in the wavelength range of 0.300 µm to 15 µm is provided. The mirror includes a substrate, a first interface layer, a first reflective layer, a second interface layer, a third interface layer, a second reflective layer, a fourth interface layer, a plurality of tuning layers including a combination of a low index material and a high index material wherein the high index material is $HfO_2$, and a protective layer. The highly reflective mirror has a reflectivity of at least 90% over the wavelength range of 335 nm to 1000 nm at an AOI 45°.

According to still other embodiments, a highly reflective mirror for use in the wavelength range of 0.300 µm to 15 µm is provided. The mirror includes a substrate, a first reflective layer, a first interface layer, a second interface layer, a second reflective layer, a third interface layer, a plurality of tuning layers including a combination of a low index material and a high index material wherein the high index material is $HfO_2$, and a protective layer. The highly reflective mirror has a reflectivity of at least 90% over the wavelength range of 335 nm to 1000 nm at an AOI 45°.

According to still other embodiments, a highly reflective mirror for use in the wavelength range of 0.300 µm to 15 µm is provided. The mirror includes a substrate, a first reflective layer, a barrier layer, a first interface layer, a second reflective layer, a second interface layer, a plurality of tuning layers including a combination of a low index material and a high index material wherein the high index material is $HfO_2$, and a protective layer. The highly reflective mirror has a reflectivity of at least 90% over the wavelength range of 335 nm to 1000 nm at an AOI 45°.

According to additional embodiments, a method for making a highly reflective mirror for use in the wavelength range of 0.300 µm to 15 µm is provided. The method includes the steps of: providing a substrate selected from the group consisting of aluminum alloys, silica, fused silica, F-doped fused silica, magnesium alloys and titanium alloys; polishing the substrate to a roughness of less than 10 nm; applying a first interface layer having a thickness in the range of 0.2 nm to 25 nm on top of the barrier layer, the thickness being dependent on the first interface layer; applying a reflective layer having a thickness in the range of 75 nm to 300 nm on top of the first interface layer; applying a second interface layer having a thickness in the range of 5 nm to 20 nm, the thickness being dependent on the first interface layer; applying a plurality of tuning layers having a combination of a low index material and a high index material wherein the high index material is $HfO_2$, the thickness of the tuning layers being dependent on the low index and high index materials; and applying a protective layer on top of the tuning layer.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

BRIEF DESCRIPTION OF THE DRAWINGS

The accompanying drawings are included to provide a further understanding, and are incorporated in and constitute a part of this specification. The drawings illustrate one or more embodiments, and together with the description serve to explain principles and operation of the various embodiments.

FIG. 1 is a cross-sectional view of a highly reflective mirror according to some embodiments of the present disclosure;

FIG. 2 is a cross-sectional view of a highly reflective mirror according to other embodiments of the present disclosure;

FIG. 3 is a cross-sectional view of a highly reflective mirror according to still other embodiments of the present disclosure;

FIG. 4 is a cross-sectional view of a highly reflective mirror according to still other embodiments of the present disclosure;

DETAILED DESCRIPTION

Figure 5:
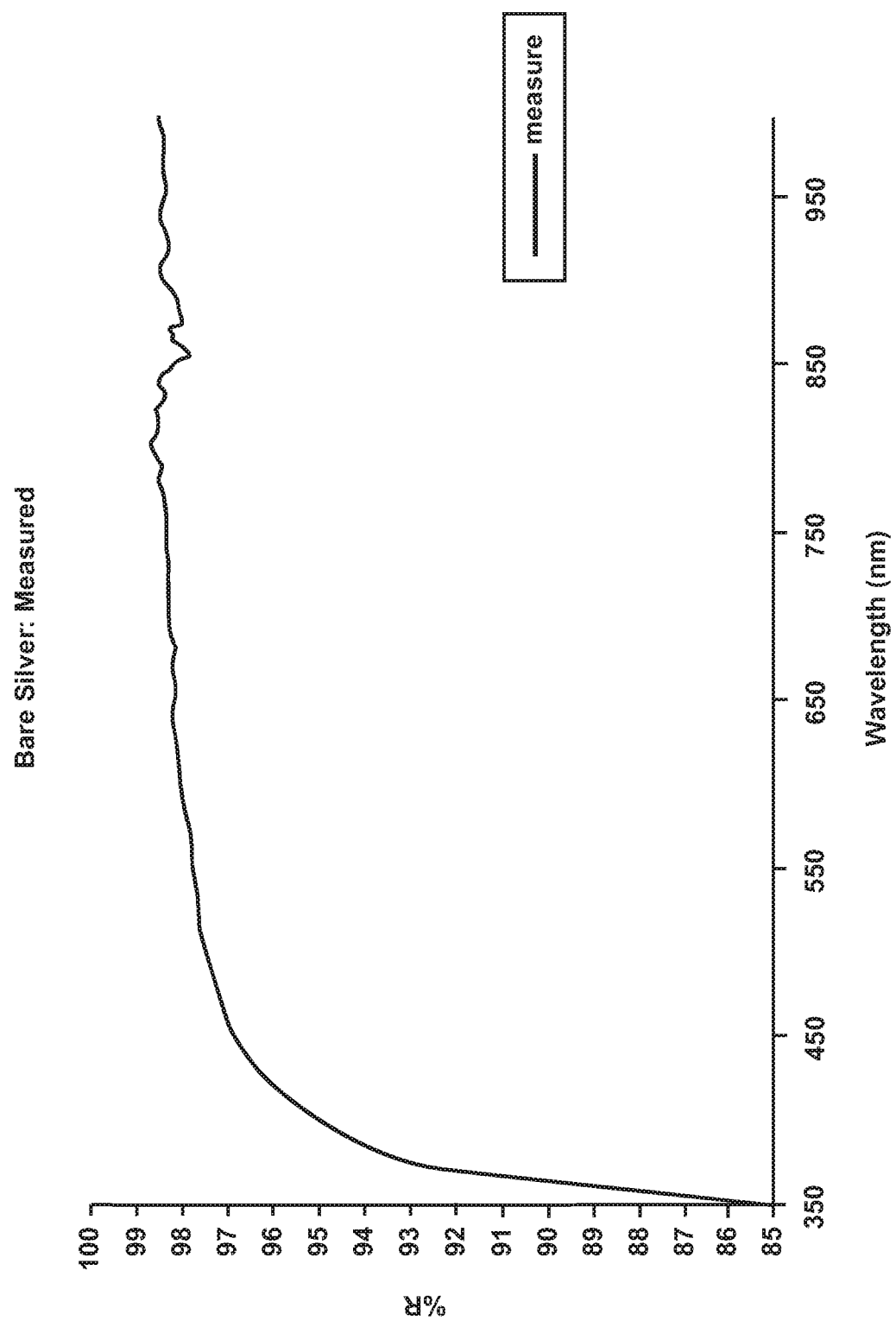
FIG. 5 is a graph of the wavelength versus percent reflectance for a bare silver film on glass from 350 nm to 1000 nm.

Reference will now be made in detail to the present preferred embodiments, examples of which are illustrated in the accompanying drawings. Whenever possible, the same reference numerals will be used throughout the drawings to refer to the same or like parts.

For purposes of description herein the terms "upper," "lower," "right," "left," "rear," "front," "vertical," "horizontal," and derivatives thereof shall relate to the device as oriented in FIG. 1. However, it is to be understood that the device may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element. The term "consisting of," is intended to cover only the elements listed and exclude any other element, step, or component not listed in the disclosed process, method, article, or apparatus language. The term "consisting essentially of," is intended to cover the specified elements, step, or components that do not materially affect the basic and novel characteristic(s) of the disclosed process, method, article, or apparatus.

Silver coatings on reflective optics have been a keystone component in Intelligence-Surveillance-Reconnaissance (ISR) detector technology that enable these systems to achieve broad multi-band reflectance for the NUV, VIS, SWIR, MWIR, and LWIR bands. The reflectivity for silver coatings is limited in the NUV region and demonstrates absorption bands in the LWIR region. These limitations are a result of the silver performance as well as the performance of the materials used in the stack to optimize and protect the silver layer. Although FIG. 5 demonstrates the drop in silver's reflectivity below 450 nm, many high index evaporation materials used in coating stacks for the visible through MWIR band applications have absorption coefficients that increase for wavelengths below 450 nm, below 400 nm, and lower. While the absorption coefficients increase for several oxide thin film coatings such as $TiO_2$ and $Nb_2O_5$, other materials such as $HfO_2$ have an absorption coefficient that is not even measureable down to 300 nm. The use of $HfO_2$ as a high index material used to tune and improve the reflectance for silver based reflective optics in the NUV and LWIR band regions can be achieved in the embodiments disclosed herein.

The term "high reflectance", as defined herein, means a reflectivity of at least 75% over the wavelength range of 0.300 μm to 15 μm. The phrase "salt fog", as used herein, may be abbreviated as "SF". The 6061-Al aluminum substrate, or other metallic substrates, is diamond turned and polished before the application of any coating materials. Glass, glass-ceramic, or ceramic substrates are ground, lapped, and polished before the application of any coating. The abbreviation "AOI" means "Angle of Incidence" and is in degrees, and the term "pol" means a "polished aluminum substrate." In the process embodiments described herein, it may be desirable that the substrate temperature be minimized during the deposition of the coating materials. When 6061-Al substrates are used, the temperature should be below the heat treating and stress relief temperatures of 6061-Al, which are 415° C. and 350° C. In some embodiments, when the 6061-Al substrate is in a T-6 condition as measured by ASTM B557, the temper or hardness can be manipulated when the temperature exceeds 200° C. for a period of time.

Referring to FIGS. 1-4, reference numeral 10 generally designates a highly reflective mirror for use in a wavelength range from 0.300 μm to 15 μm. The highly reflective mirror 10 includes a substrate 14, a first interface layer 18, a first reflective layer 22, a second interface layer 26, a plurality of tuning layers 30 including a low index material and a high index material wherein the high index material is $HfO_2$, and a protective layer 42. The highly reflective mirror 10 has a reflectivity of at least 90% over the wavelength range of 335 nm to 1000 nm at an AOI 45°. In some embodiments, the highly reflective mirror 10 may also include a barrier layer 46 which may include a corrosion resistant layer, an abrasion resistant layer, a stress tuning layer, or a combination thereof.

Referring to FIG. 1, in some embodiments the highly reflective mirror 10 may include the substrate 14, the barrier layer 46, the first interface layer 18, the first reflective layer 22, the second interface layer 26, the plurality of tuning layers 30 including the low index material and the high index material wherein the high index material 38 is $HfO_2$, and the protective layer 42. The highly reflective mirror 10 has a reflectivity of at least 90% over the wavelength range of 335 nm to 1000 nm at an AOI 45°. In some embodiments, the barrier layer 46 of the highly reflective mirror 10 may include a corrosion resistant layer, an abrasion resistant layer, a stress tuning layer, or a combination thereof.

Referring to FIG. 2, in some embodiments the highly reflective mirror 10 may include the substrate 14, the barrier layer 46, the first interface layer 18*a*, the first reflective layer 22*a*, the second interface layer 26*a*, a third interface layer 50, a second reflective layer 54, a fourth interface layer 58, the plurality of tuning layers 30, and the protective layer 42. The highly reflective mirror 10 has a reflectivity of at least 90% over the wavelength range of 335 nm to 1000 nm at an AOI 45°. In some embodiments, the barrier layer 46 of the highly reflective mirror 10 may include a corrosion resistant layer, an abrasion resistant layer, a stress tuning layer, or a combination thereof.

Referring now to FIG. 3, in some embodiments the highly reflective mirror 10 may include the substrate 14, the first reflective layer 22*a*, the first interface layer 18*b*, the second interface layer 26*b*, the second reflective layer 54, the third interface layer 50*a*, the plurality of tuning layers 30, and the protective layer 42. The highly reflective mirror 10 has a reflectivity of at least 90% over the wavelength range of 335 nm to 1000 nm at an AOI 45°. In some embodiments, the highly reflective mirror 10 may also include the barrier layer 46 which may include a corrosion resistant layer, an abrasion resistant layer, a stress tuning layer, or a combination thereof.

Referring now to FIG. 4, in some embodiments the highly reflective mirror 10 may include the substrate 14, the first reflective layer 22*a*, the barrier layer 46, the first interface layer 18*c*, the second reflective layer 54, the second interface layer 26*c*, the plurality of tuning layers 30, and the protective layer 42. The highly reflective mirror 10 has a reflectivity of at least 90% over the wavelength range of 335 nm to 1000 nm at an AOI 45°. In some embodiments, the barrier layer 46 of the highly reflective mirror 10 may include a corrosion resistant layer, an abrasion resistant layer, a stress tuning layer, or a combination thereof.

Referring again to FIGS. 1-4, the first interface layers 18, 18*a*, 18*b*, 18*c*, the second interface layers 26, 26*a*, 26*b*, 26*c*, the third interface layers 50, 50*a*, and the fourth interface layer 58 are used herein to specifically refer to the respective positioning of the stack embodiments provided for the highly reflective mirror 10 and are not meant to refer to a common set of materials used for the respective layer. For example, the second interface layer 26 in FIG. 1 can be $Al_2O_3$ and is coupled between the first reflective layer 22 and the plurality of tuning layers 30 while the second interface layer 26*a* in FIG. 2 can be $YbF_3$ and is coupled between the first reflective layer 22*a* and the third interface layer 50. The materials than can be used for the second interface layer 26 and the second interface layer 26*a* are different in these two embodiments as determined by the adjacent layers the second interface layers 26, 26*a* are positioned, coupled, or layered in between. Table 1 below generally illustrates the five types of layers found in the stack embodiments provided for the highly reflective mirror 10 including the substrate 14, the barrier layer 46, at least one interface layer 18, 26, 50, 58, at least one reflective layer 22, 54, the plurality of tuning layers 30, and the protective layer 42.

TABLE 1

| Coating Design and Materials | | |
| --- | --- | --- |
| Layer | Layer Characteristics | Exemplary Materials |
| Protective Layer(s) | The layer possesses a high level of both chemical and mechanical durability | $YbF_3$, $YF_3$, $Si_3N_4$, YbFO, $Yb_xF_yO_z$, $SiO_2$, AlON |
| Tuning Layer(s) | A low refractive index, high refractive index | $HfO_2$, YbFO, $YbF_3$, |

TABLE 1-continued

Coating Design and Materials

| Layer | Layer Characteristics | Exemplary Materials |
|---|---|---|
| | design is used for layer tuning. The materials must be low absorbing in the wavelength range of from .300 μm to 15.0 μm, and possess a medium to high level of chemical and mechanical durability | $YF_3$, $GdF_3$, $Bi_2O_3Yb_xF_yO_z$ |
| Second Interface Layer (2$^{nd}$ Layer) | This layer is used to promote adhesion and galvanic compatibility of the tuning layers to the first and/or second reflective layer, the first and/or second reflective layers to the third interface layer, the first and/or second reflective layers to the first interface layer | $Bi_2O_3$, ZnS, $Nb_2O_5$, $TiO_2$, $Ta_2O_5$, $Al_2O_3$, $InO_2$, InSnO |
| Reflective Layer | Silver (Ag) is used as the first and/or second reflective layer to provide high reflectance (high % R) in the wavelength range of .35 μm to >15 μm | Ag, Au, Al, Rh, Cu, Pt, Ni |
| First Interface Layer (1$^{st}$ Layer) | This interface layer is used to promote adhesion and galvanic compatibility between the barrier layer and the first and/or second reflectance layer, and the reflectance layer and the second interface layer | $Al_2O_3$, $TiO_2$, $Bi_2O_3$, ZnS, Ni, Bi, Monel (Ni—Cu), Ti, Pt, InSnO |
| Barrier Layer | This layer is used to create galvanic compatibility between the Ag reflective layer (0.15 v) and the Al substrate (0.9 v). This layer may also provide corrosion, abrasion (scratch), and stress resistance | $Si_3N_4$, $SiO_2$, TiAlN, TiAlSiN, $TiO_2$, DLC, Al, CrN, $Si_xN_yO_z$, NiCrN, Cr, NiCr, Ni, $AlO_xN_y$ |
| Substrate | A light weight diamond turned optic/substrate, for example 6061 aluminum (6061-Al) and other Al alloys, Mg alloys, Ti alloys, and ceramic alloys. A barrier layer is needed for metal alloys and its thickness is substrate dependent | silica, fused silica and F-doped fused silica; and 6061-Al alloy, other light weight Al alloys Mg alloys, Ti alloys, silicon |

1. The interface layers are also referred to as "adhesion" layers.
2. $Yb_xF_yO_z$ is formed when oxygen is admitted during the depositions of $YbF_3$. Electronically, $nYb^{+3} = yF^{-1} + zO^{-2}$ so that the sum of the positive and the negative valances balance and there is no net charge to the coating layer. The same is true for $Si_xN_yO_z$.

Substrate and Barrier Layer

The thickness of the barrier layer 46 can be in the range of 100 nm to 50 μm. In some embodiments, the barrier layer 46 has a thickness in the range of 500 nm to 10 μm. In other embodiments, the barrier layer 46 has a thickness in the range of 1 μm to 5 μm. One criterion for determining the thickness of the barrier layer 46 is the number of hours the article will have to withstand the salt fog test. The longer the duration of the salt fog test, the thicker the barrier layer 46 required. In some embodiments, for a salt fog test of 24 hours, a thickness of 10 μm may be sufficient for the barrier layer 46. In many applications, if the barrier layer 46 is too thick, it will cause distortion of the finished part with changes in temperature, but since the operational temperature is typically given in the specification, the thickness of the barrier layer 46 can be adjusted to prevent distortion. The differences in the thermal expansion coefficients of the barrier layer 46 and the substrate 14 will cause the optical figure, power, and irregularity, to change with changes in temperature (ΔT). In some embodiments, the barrier layer 46 is sufficiently thick so that it will cover or smooth out any high and irregular substrate peak-to-valley variations. Smoothing out such variations aids in polishing the surface to optimize surface quality. The surface quality is important in promoting adhesion on the entire surface and minimizing localized defect sites that may be caused by the peak-to-valley variations.

Since, in some embodiments, 6061-Al is the substrate material used in these applications, the barrier layer 46 must be used between the silver layer and the substrate 14, or an Al layer deposited on any of the foregoing substrates, to create galvanic compatibility. In other embodiments, the substrate material includes at least one material selected from the group consisting of 6061-Al, diamond machined alloys, silica, fused silica, F-doped fused silica, and combinations thereof. The military standards for the use of dissimilar metals are defined in MIL-STD-889B and MIL-STD-1250. For systems that are expected to be exposed to harsh environments such as hot and humid and/or containing salts, these military documents suggest, that dissimilar metals should not be joined or interfaced if they exceed a galvanic potential difference of 0.25 V (in a high humid environment with no salts the potential difference can be >0.45V). In some of the engineering literature on corrosion, a potential difference of 0.15V is suggested for harsh salt environments. 6061-Al is considered an anodic material with a potential of 0.90 V while silver, a cathodic material, has a potential of 0.15 V, resulting in a potential difference of 0.75 V. Interfacing anodic metals to Al as the barrier material, for example, cadmium, iron, and carbon, results in a low potential difference of 0.25 V. The galvanic potential difference is >0.25 V for tin, 0.33 V for chromium, 0.33 V for zinc, 0.63 V for nickel, and 0.83 V for magnesium. TiAlN can also be effectively used as a barrier material (TiAlN can be made to behave like metal or like a dielectric depending on the Ti:Al ratio), in addition to (dielectric) coatings such as diamond like carbon (DLC), $Al_2O_3$, $Si_3N_4$, $Si_xN_yO_z$, $SiO_2$, and $TiO_2$. While CrN has been used with some success, care must be exercised in view of the intended application because its galvanic compatibility is border-line.

The surface quality of the 6061-Al can play an important role in coupling the barrier layer 46 or first reflective layer 22. Large precipitate sites are formed by the "impurities" in the 6061-Al, some of which come from the controlled addition of materials required in order to meet material specifications for strength characteristics, and other impurities are simply contaminants. The large precipitates make it difficult to achieve a smooth surface, <30 Å rms, and some of the high peaks or nodules may result in poor adhesion (or cracking from stresses or voids) between the substrate 14 and the coating stack (silver layer, or silver layer covers differently), resulting in a defect site once the completed mirror is exposed to the environmental testing using both salt fog and long term humidity conditions. An approach to manage this condition is to deposit a very thick barrier layer 46 that results in an effective coating over these sites. In some embodiments, the barrier layer 46 comprises at least one material selected from the group consisting of $Si_3N_4$, $Si_xN_yO_z$, $SiO_2$, TiAlN, TiAlSiN, $TiO_2$, $Si_xN_yO$, DLC, Al, $Al_2O_3$, and combinations thereof. In other embodiments, the barrier layer 46 consists essentially of at least one material selected from the group consisting of $Si_3N_4$, $Si_xN_yO_z$, $SiO_2$, TiAlN, TiAlSiN, $TiO_2$, $Si_xN_yO$, DLC, Al, $Al_2O_3$, and combinations thereof. In still other embodiments, the barrier layer 46 consists of at least one material selected from the group consisting of $Si_3N_4$, $Si_xN_yO_z$, $SiO_2$, TiAlN, TiAlSiN, $TiO_2$, $Si_xN_yO$, DLC, Al, $Al_2O_3$, and combinations thereof.

The presence of large precipitates create a non-homogenous surface which makes it difficult to obtain a surface finish less than 60 Å rms, the best results being about 30 Å rms, which was obtained with difficulty. The presence of the nodules serves to illustrate why the presence of the barrier works to improve reflectivity. Without being held to any particular theory, the nodules can become defect sites where localized corrosion occurs when exposed to these harsh environments. They may result in poor adhesion, so coating cracks or falls off at sites exposing areas or creating pathways. A sufficiently thick barrier layer 46 can smooth out this surface and create a continuous film with good adhesion across the entire surface. If this barrier layer 46 surface is sufficiently thick, polishing the layer prior to the placement of additional coating layers would result in better surface finish in the approximate range of 5 Å to 15 Å.

The thickness of the barrier layer 46 can be in range of 10 nm to 250 nm, 10 nm to 100 μm, or 10 nm to 50 nm. When the nodules or other surface defects are present on the substrate 14 and cannot be removed, the barrier layer 46 is in the higher end of the range and must be sufficient to cover the nodules. If the substrate 14 is substantially free of the nodules then the barrier layer 46 can be at the lower end of the range. In addition, the use of ion assistance during the deposition of the barrier layer 46 will densify the barrier layer 46 and aid in providing a smooth surface.

In some embodiments, like those depicted in FIG. 4, the barrier layer 46 would need to be relatively thin (e.g., 10 nm to 100 nm, 10 nm to 50 nm, or 20 nm to 80 nm) so as to not lose the reflectivity provided by the first reflective layer 22.

In some embodiments, the barrier layer 46 can include a corrosion resistant layer, an abrasion resistant layer (scratch resistant layer), a stress tuning layer, or a combination thereof. The corrosion resistant layer may be used when the highly reflective mirror 10 is exposed to extended humidity as measured by the salt fog tests. Materials such as $Nb_2O_5$ can be advantageous to absorb compressive stresses applied to the highly reflective mirror 10 and materials such as $YbF_xO_y$ (e.g. YbFO, $Yb_2F_4O$, $Yb_2F_2O_2$) can be advantageous to absorb tensile stresses applied to the highly reflective mirror 10. In some embodiments, the barrier layer 46 includes the corrosion resistant layer cast from $Si_3N_4$, $SiO_xN_y$, $SiO_2$, CrN, NiCrN, Cr, NiCr, Ni, diamond like carbon (DLC), or a combination thereof. In other embodiments, the barrier layer 46 includes the abrasion resistant layer (scratch resistant layer) cast from $Si_3N_4$, $SiO_xN_y$, $SiO_2$, $AlO_xN_y$, AlN, $YbF_3$, $YbF_xO_y$, diamond like carbon (DLC), or a combination thereof. In still other embodiments, the barrier layer 46 includes the stress tuning layer cast from $Si_3N_4$, $SiO_xN_y$, $SiO_2$, $Nb_2O_5$, fluorides, metals, metal oxides such as $Ta_2O_5$ and $TiO_2$, or a combination thereof.

In some embodiments, the barrier layer 46 can provide a corrosion resistant layer, an abrasion resistant layer (scratch resistant layer), and a stress tuning layer. In these embodiments where all three protective layers are provided by the barrier layer 46, an exemplary stack of layers for the barrier layer 46, from the substrate 14 moving up to the protective layer 42, can include: $Nb_2O_5$, YbFO, $Nb_2O_5$, YbFO, $Nb_2O_5$, YbFO, and $Nb_2O_5$.

First and Second Reflective Layers

For the first reflective metal layer 22 and/or second reflective metal layer 54 the thickness must be sufficient to provide optimum reflection properties. If the first reflective metal layer 22 and/or second reflective metal layer 54 are too thin the film is not continuous and/or transmitting and if it is too thick durability can become a concern. In some embodiments, the thickness of the first reflective metal layer 22 and/or second reflective metal layer 54 may be in the range of 5 nm to 350 nm, 75 nm to 350 nm, 1 nm to 250 nm, 1 nm to 100 nm, 1 nm to 30 nm, or 5 nm to 50 nm. In other embodiments, the thickness of the first reflective metal layer 22 and/or second reflective metal layer 54 may be in the range of 80 nm to 150 nm. In still other embodiments, the thickness of the first reflective metal layer 22 and/or second reflective metal layer 54 may be in the range of 90 nm to 120 nm. When both the first reflective layer 22 and the second reflective layer 54 are used together in stack configurations, the second reflective layer 54 has to be thick enough to provide some reflection but thin enough for light to access the reflective properties of the first reflective layer 22 positioned below (5 nm to 10 nm). In some embodiments, the second reflective layer 54 can have a thickness of 5 nm to 10 nm or 5 nm to 20 nm.

In addition to using Ag as the reflective material, the stack configuration can also be used with other reflective materials, for example Au, Al, Rh, Cu, Pt, Ni, to provide an enhanced durable, chemical, and mechanical performance, but with a change in spectral range and reflection intensity. In some embodiments, the first reflective layer 22 may be Ag, Au, Al, Rh, Cu, Pt, and/or Ni. In some embodiments, the first reflective layer 22 may be Ag or Al. In some embodiments, the first reflective layer 22 comprises at least one material selected from the group consisting of Al, Rh, Cu, Pt, Ni, and combinations thereof. In other embodiments, the first reflective layer 22 consists essentially of at least one material selected from the group consisting of Al, Rh, Cu, Pt, Ni, and combinations thereof. In still other embodiments, the first reflective layer 22 consists of at least one material selected from the group consisting of Al, Rh, Cu, Pt, Ni, and combinations thereof. In some embodiments, the second reflective layer 54 may be Ag, Au, Al, Rh, Cu, Pt, Ni, or a combination thereof. In other embodiments, the second reflective layer 54 may be Ag or Al. In still other embodiments, the second reflective layer 54 may be Ag. In some embodiments, the second reflective layer 54 comprises at least one material selected from the group consisting of Ag, Au, Al, Rh, Cu, Pt, Ni, and a combination thereof. In other embodiments, the second reflective layer 54 consists essentially of at least one material selected from the group consisting of Ag, Au, Al, Rh, Cu, Pt, Ni, and a combination thereof. In still other embodiments, the second reflective layer 54 consists of at least one material selected from the group consisting of Ag, Au, Al, Rh, Cu, Pt, Ni, and a combination thereof.

Due to the multiband reflection requirements, ranging from visible (VIS) through the long wave infrared (LWIR), 0.300 µm out through 15 µm, a thin film layer of silver is used for the first and/or second reflective layer. Silver is known to have the highest reflectivity, lowest polarization splitting, and lowest emissivity through this entire wavelength range. [See S. A. Kovalenko and M. P. Lisita, "Thickness dependences of optical constants for thin layers of some metals and semiconductors," Semiconductor Physics, Quantum Electronics and Optoelectronics Vol. 4, No. 4, pages 352-357 (2001); Chang Kwon Hwangbo, et al, "Ion assisted deposition of thermally evaporated Ag and Al films", Applied Optics Vol. 28, No 14, (Jul. 15, 1989); and N. Thomas et al, "Protected Silver Coating for Flashlamp-Pumped Nd: glass Amplifiers," 30th Annual Symposium on Optical Materials for High Power Lasers; Boulder, Colo. Sep. 30-Oct. 2, 1998; (preprint from Lawrence Livermore Laboratories; site location http://library.llnl.gov/uhtbin/cgi-sirsi/mgYv2G09Sa/MAIN/103110005/60/502/-X; search term "30$^{th}$ annual symposium," Paper #1, 236354 (UCRL-JC-135179, preprint)]. The following characteristics associated with silver and the corresponding multiband imaging system embodiments disclosed herein are provided below:

(1) The silver layer may have a minimum thickness of 150 nm to obtain optimum reflectivity depending on the process used to deposit the silver. In some embodiments, the first reflective layer 22 and/or second reflective layer 54 may have a silver layer thickness in the range of 135 nm to 175 nm.

(2) Ion-assisted deposition (IAD) of silver can improve its chemical durability since the process used to deposit the silver layer can influence the durability of the silver layer. In some embodiments, reflection loss can be observed at the 400 nm range of the pretest IAD scan, which may be due to the trapping of gas atoms used for bombardment.

First, Second, Third, and Fourth Interface Layers

The thickness of the first interface layer 18, second interface layer 26, third interface layer 50, and fourth interface layer 58 are dependent on factors including what material is used for the respective interface layers. For example, whether the layer is the first interface layer 18, second interface layer 26, third interface layer 50, and fourth interface layer 58, and whether it is on the front surface (the surface of the reflective layer) or back surface (the layer on which the reflective layer is deposited) of the mirror. When Ni, Cr and Ti materials are used as the interface layer only a thin layer of material, on the order of angstroms "Å", is used. For a front surface mirror the interface layer on top of the reflective layer, that is, the second or greater interface layer, needs to be thick enough to promote adhesion, but also thin enough so that it does not absorb any of the reflected radiation. In general, the thickness of the first interface layer is in the range of 2 Å to 250 Å (0.2 nm to 25 nm). For metallic interface layers, for example Ni and Cr, the thickness is in the range of 2 Å to <25 Å (0.2 nm to <2.5 nm). In some embodiments, the metallic first interface layer thickness is in the range of 2 Å to 10 Å (0.2 nm to 1 nm). When a metal oxide or sulfide, for example $Al_2O_3$ or ZnS, is used as the first interface layer the thickness is greater than 25 Å (>2.5 nm). In other embodiments, the first interface layer is a metal oxide or sulfide with a thickness in the range of 50 Å to 250 Å (5 nm to 25 nm). In still other embodiments, the first interface layer thickness is in the range of 10 nm to 20 nm.

The interface layer used under the first reflective layer 22 or second reflective layer 54 may be present to promote adhesion so that optical considerations such as the absorption of reflection radiation are not a consideration. Consequently, the thickness of these interface layers is determined based on adhesion and not optical considerations. As a result, the interface layers positioned under the first reflective layer 22 and/or second reflective layer 54 can have a minimum thickness to provide the adhesion, but no maximum thickness because there is no absorption or optical concerns. However, the thickness of the interface layer used above the first and/or second reflective layers has to be carefully controlled so the reflection losses are minimized. In some embodiments, for the interface layers used above the first and/or second reflective layers the thickness is in the range of 5 nm to 20 nm. In other embodiments, the thickness of the interface layers used above the first and/or second reflective layers is in the range of 8 nm to 15 nm. In still other embodiments, where the highly reflective mirror 10 is intended for use in the wavelength range of 0.300 µm to 15 µm, the thickness of the interface layers used above the first and/or second reflective layers is in the range of 1 nm to 100 nm to maximize the reflectance of the final highly reflective mirror 10. In some embodiments, the first interface layer 18, second interface layer 26, third interface layer 50, and fourth interface layer 58 may have a thickness of 1 nm to 250 nm, 1 nm to 100 nm, 1 nm to 50 nm, 1 nm to 25 nm, 1 nm to 15 nm, 20 nm to 40 nm, 20 nm to 60 nm, 20 nm to 55 nm, 5 nm to 30 nm, or a combination thereof.

Silver and gold have considerably lower oxide formation energies compared to other metals like titanium, aluminum, chromium, and nickel. Due to this lower oxide formation energy, silver and gold do not adhere well to many materials. It has been known for some time that ultra-thin films of Cr and Ni, or alloys of these metals, are excellent adhesion promoters for silver due to the metal-to-metal diffusion with Ag (or gold), along with metallic bonding strengths between Ag or Au and Cr or Ni. Because of the environments the mirrors disclosed herein will be exposed to, galvanic compatibility is critical and therefore must be considered when choosing the interface material. The galvanic potential difference at the interface of silver-Cr and silver-Ni are 0.45 V and 0.15 V respectively. Nickel or $Al_2O_3$ may be used as the interface layers used under the first reflective layer 22 and/or second reflective layer 54 between the barrier layer 46 and the first and/or second reflective layers because the two materials are compatible.

$Al_2O_3$ has been discussed in the literature as an adhesion promoting material for certain metals; specifically the discussion involves Ag—$Al_2O_3$ and Al—$Al_2O_3$ non-stoichiometric interfaces, and how they influence adhesion (W. Zhang and J. R. Smith, Nonstoichiometric interfaces and $Al_2O_3$ adhesion with Al and Ag, Physical Review Letters, Vol 85, No 15, Oct. 9, 2000, pages 3225-3228; Jiwei Feng, et al., Ab initio study of Ag/$Al_2O_3$ and Au/$Al_2O_3$ interfaces, Physical Review B, 72, 115423, Sep. 21, 2005). The data in these papers demonstrate how stoichiometric deviations of $Al_2O_3$ at the interface can significantly affect adhesion with the either Ag or Al metal, two metals chosen for their oxide heats of formation being at opposite end of the range. M. A. Scobey, U.S. Pat. No. 5,851,365 titled "Low Pressure Reactive Magnetron sputtering apparatus and method," describes the conditions for two types of deposition processes: ion-assisted deposition (IAD) and e-beam deposition, and a low pressure reactive magnetron sputtering process, that produce optimum adhesion between $Al_2O_3$—Ag, and $Al_2O_3$—Al. Due to the interface located on the backside of the first reflective layer 22 and/or second reflective layer 54, between the substrate 14 and the Ag layer, its upper limit of thickness is not limited by absorption, but should be monitored for stress considerations. On the front side of the first reflective layer and/or second reflective layer 54, the interface layer, the layer deposited on top of the Ag layer, will have a thickness of interface that must be limited to minimize its absorption band in the LWIR band while obtaining optimum adhesion to Ag. ZnS is an additional non-conducting material that can be used as an adhesion layer, avoiding galvanic compatibility issues. For example, ZnS has been found to be a successful interface material, for example, at the gold interface Au—ZnS—$YbF_3$ or the silver interface Ag—ZnS—$YbF_3$.

In some embodiments, if the first reflective layer 22 is aluminum, using an oxide can promote oxidation of some of the aluminum surface and reduce reflectivity in the UV and low end of the visible wavelengths; in these embodiments, a fluoride compound can be used as an alternative to prevent this oxidation. In some embodiments, fluoride compounds such as $MgF_2$ or $AlF_3$ can work best for an aluminum first reflective layer 22 so the aluminum surface is not oxidized and the metals or metal compounds can absorb well. In other embodiments, the first interface layer 18 can be ZnS when applied to a gold and/or platinum first and or second reflective layer 22, 54.

In some embodiments, $YbF_3$ or another fluoride compound can be used as the first interface layer 18, second interface layer 26, third interface layer 50, and/or fourth interface layer 58 when coupled to aluminum (Al) making up the first reflective layer 22 and/or second reflective layer 54. In other embodiments, $Al_2O_3$ can be used as the first interface layer 18, second interface layer 26, third interface layer 50, and/or fourth interface layer 58 when coupled to silver (Ag) making up the first reflective layer and/or second reflective layer 54.

The Protective Layer and Plurality of Tuning Layers

The thicknesses of the plurality of tuning layers 30 depend on the optimization necessary to achieve the required spectral performance while simultaneously optimizing the protection necessary to pass the required tests, for example, the salt fog and humidity tests. The thickness of these layers can vary significantly depending on application and materials used.

An Ag mirror prepared using the scheme and materials described in Table 1, the embodiments disclosed herein, and the embodiments disclosed in FIGS. 1-4 can have the following advantages: the highly reflective mirror 10 can have a reflectivity of at least 90% over the wavelength range of 300 nm to 15 µm at an AOI 45°; the highly reflective mirror 10 can have a reflectivity of at least 90% over the wavelength range of 300 nm to 1000 nm at an AOI 45°; the highly reflective mirror 10 can have a reflectivity of at least 90% over the wavelength range of 335 nm to 1000 nm at an AOI 45°; the highly reflective mirror 10 can have a reflectivity of at least 90% over the wavelength range of 300 nm to 400 nm at an AOI 45°; the highly reflective mirror 10 can have a reflectivity of at least 90% over the wavelength range of 335 nm to 400 nm at an AOI 45°; the highly reflective mirror 10 has a reflectivity of at least 75% over the wavelength range of 300 nm to 15 µm at an AOI 45°; the highly reflective mirror 10 has a reflectivity of at least 75% over the wavelength range of 300 nm to 1000 nm at an AOI 45°; the highly reflective mirror 10 has a reflectivity of at least 75% over the wavelength range of 300 nm to 400 nm at an AOI 45°; the highly reflective mirror 10 has a reflectivity of at least 75% over the wavelength range of 330 nm to 400 nm at an AOI 45°; and/or the highly reflective mirror 10 has a reflectivity of at least 75% or 90% over the wavelength range of 300 nm to 400 nm, 300 nm to 375 nm, 300 nm to 350 nm, 337 nm to 350 nm, 337 nm to 360 nm, 337 nm to 375 nm, and/or 337 nm to 400 nm at an AOI 45°.

Because different applications of the mirrors disclosed herein require the application of the plurality of tuning layers 30 in order to optimize reflection in defined wavelength regions, these plurality of tuning layers 30 need to have characteristics similar to those of the protective layer 42, but some minimal trade-offs can be made in the durability of these materials. To tune for the desired reflectance bands, the thickness of the plurality of tuning layers 30 will have to be varied and a combination of low, medium and/or high index materials are used. In some embodiments, the thickness of the plurality of tuning layers 30 is in the range of 75 nm to 300 nm. In some embodiments, the protective layer 42 applied on top of the plurality of tuning layers 30 has a thickness in the range of 60 nm to 200 nm.

Corning has developed thin film deposition processes, for example the process described in U.S. Pat. No. 7,242,843, incorporated herein by reference in its entirety, which can be used for ytterbium fluoride ($YbF_3$) and yttrium fluoride ($YF_3$), both of which are low refractive index materials. When the process is used to coat highly reflective silver mirrors, the results indicate that the resulting mirrors are highly resistant to alkali solutions while also providing scratch resistance that meets the military specification moderate abrasion testing procedures; properties that will aid in protecting the silver layer. The low refractive index materials were used in combination with high refractive index materials, for example, niobium pentoxide ($Nb_2O_5$) and zinc sulfide (ZnS).

In the embodiments disclosed herein, the use of $HfO_2$ as the high refractive index material in the plurality of tuning layers 30 is desired. The use of $HfO_2$ as the high refractive index material and the use of YbFO as an exemplary low refractive index fluoride material can be used to provide a coating combination of YbFO—$HfO_2$—YbFO that can be tuned for improved reflectivity in the NUV and LWIR ranges, such as in the 330 nm to 400 nm band. When oxygen is used during the deposition of the $YbF_3$ material the deposited layer becomes a ytterbium oxyfluoride material that is designated herein as $Yb_xF_yO_z$, and the thickness of this layer is the in the same range as that for $YbF_3$.

Figure 6A:
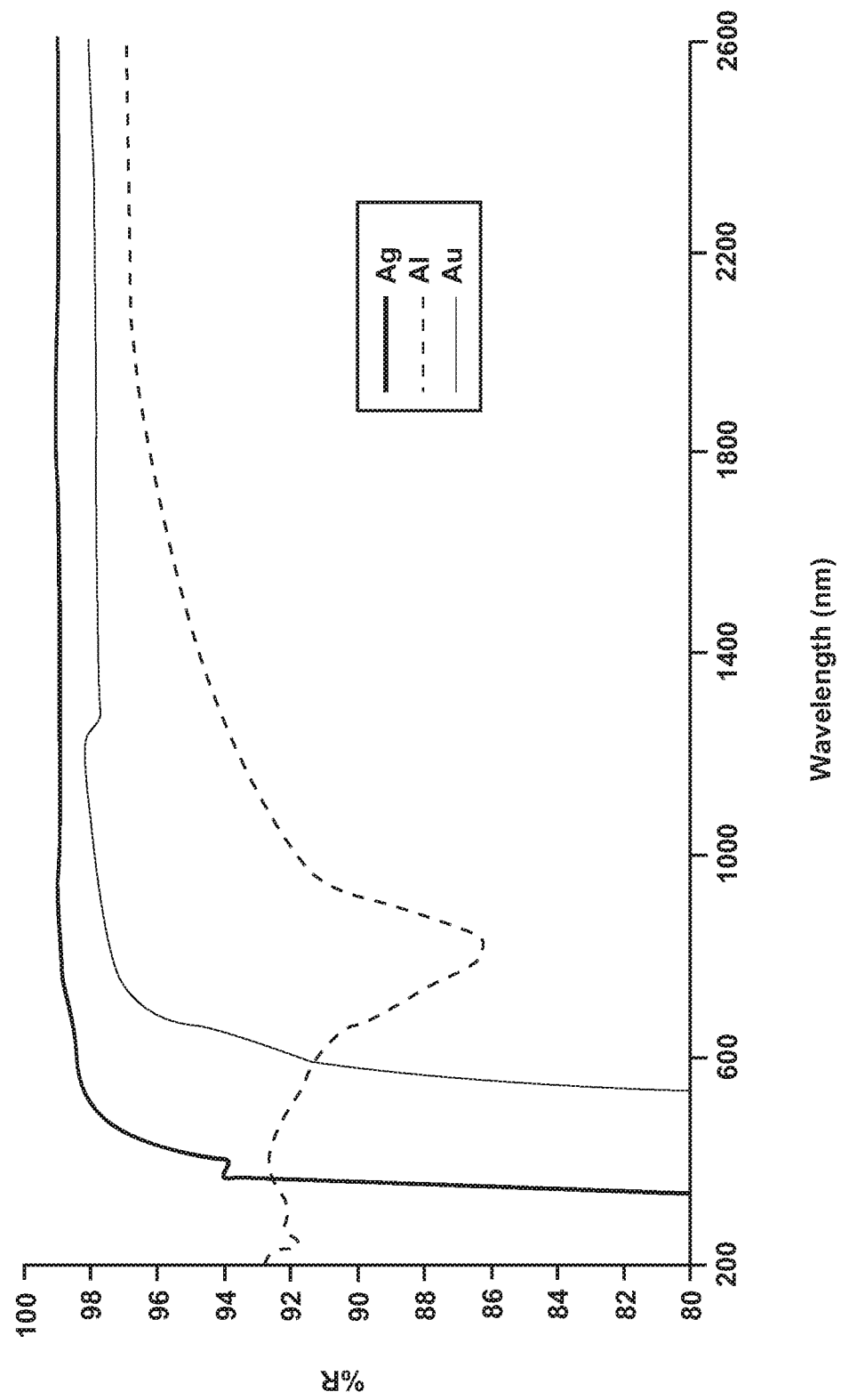
FIG. 6A is a graph of the wavelength versus percent reflectance for bare aluminum, silver, and gold films on glass from 200 nm to 2600 nm.
Figure 6B:
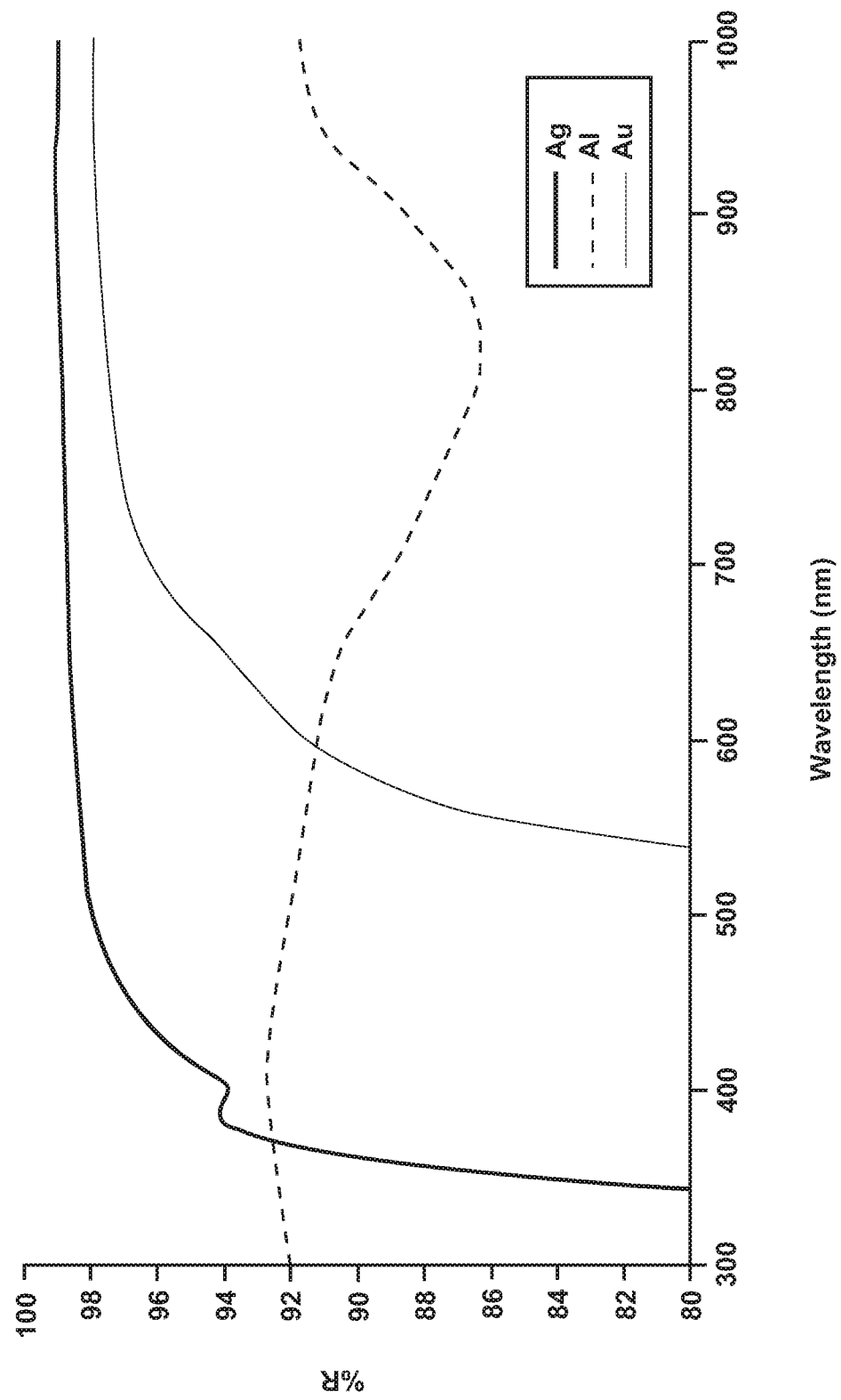
FIG. 6B is an expanded range of the UV portion of FIG. 6A showing the wavelength versus percent reflectance for bare aluminum, silver, and gold films on glass from 300 nm to 1000 nm.

FIG. 5 demonstrates the drop in silver's reflectivity for wavelengths below 450 nm. This drop in reflectivity below 450 nm has been found herein to be adjusted and tuned using $HfO_2$ as the high refractive index material in the plurality of tuning layers 30 combined with low refractive index materials such as YbFO. Another technique that can be used herein is to add a very thin gold (Ag) or aluminum (Al) layer on top of a thick metal layer or highly polished metal substrate 14. These materials, in particular aluminum, have improved reflection properties in the NUV as shown in FIGS. 6A and 6B. The ability to add a layer of aluminum or other metal to a thick substrate 14 such as 6160-Al has been described in U.S. patent application Ser. No. 14/865,380 and U.S. patent application Ser. No. 14/679,339 which are incorporated herein by reference in their entirety. FIG. 6B in particular shows the improved reflectance in the 330 nm to 400 nm wavelength range for aluminum over both silver and gold.

Figure 7:
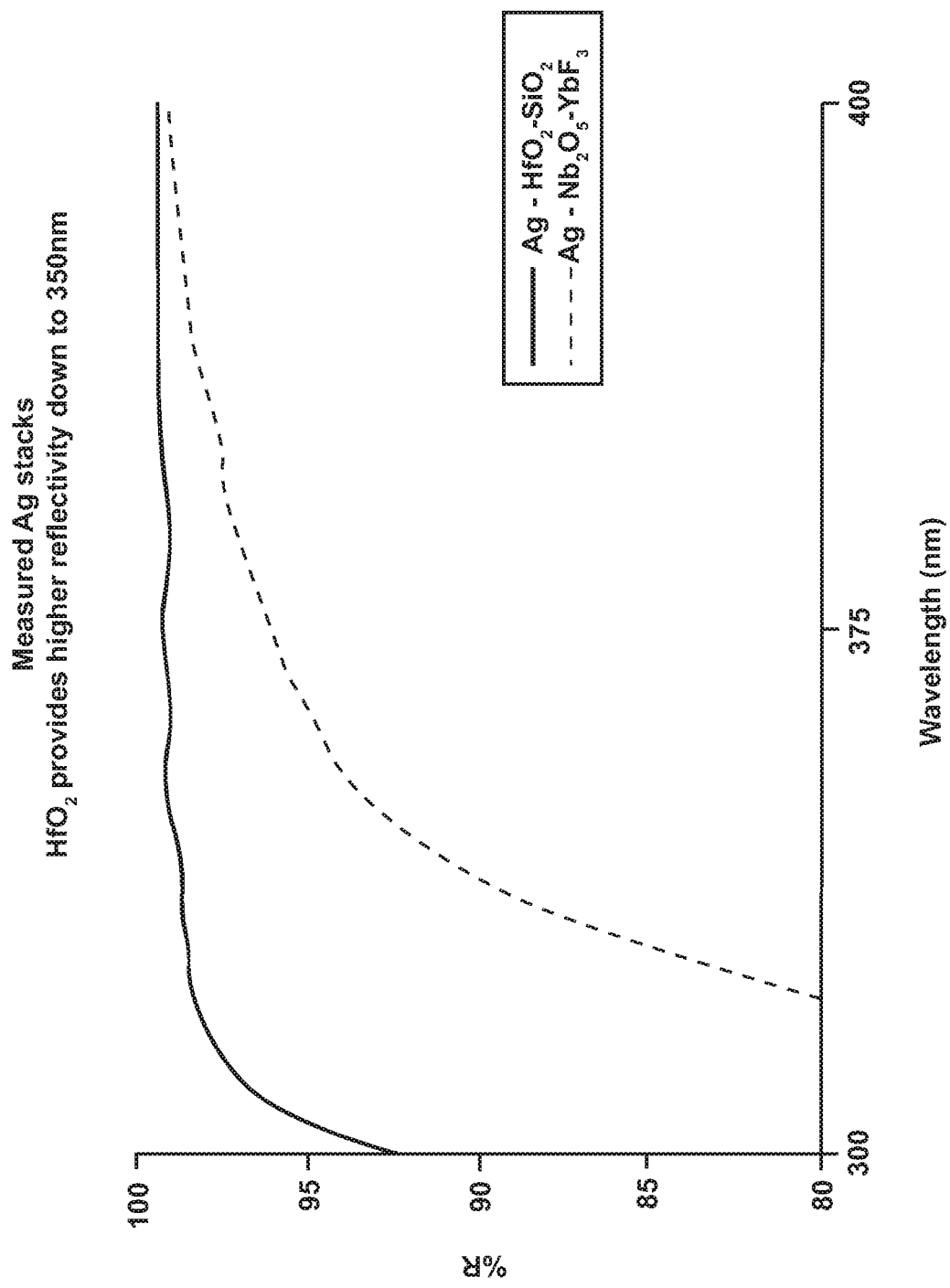
FIG. 7 is a graph of the wavelength versus percent reflectance for a silver stack having a $HfO_2$—$SiO_2$ tuning layer and a silver stack having a $Nb_2O_5$—$YbF_3$ tuning layer from 350 nm to 400 nm.
Figure 8:
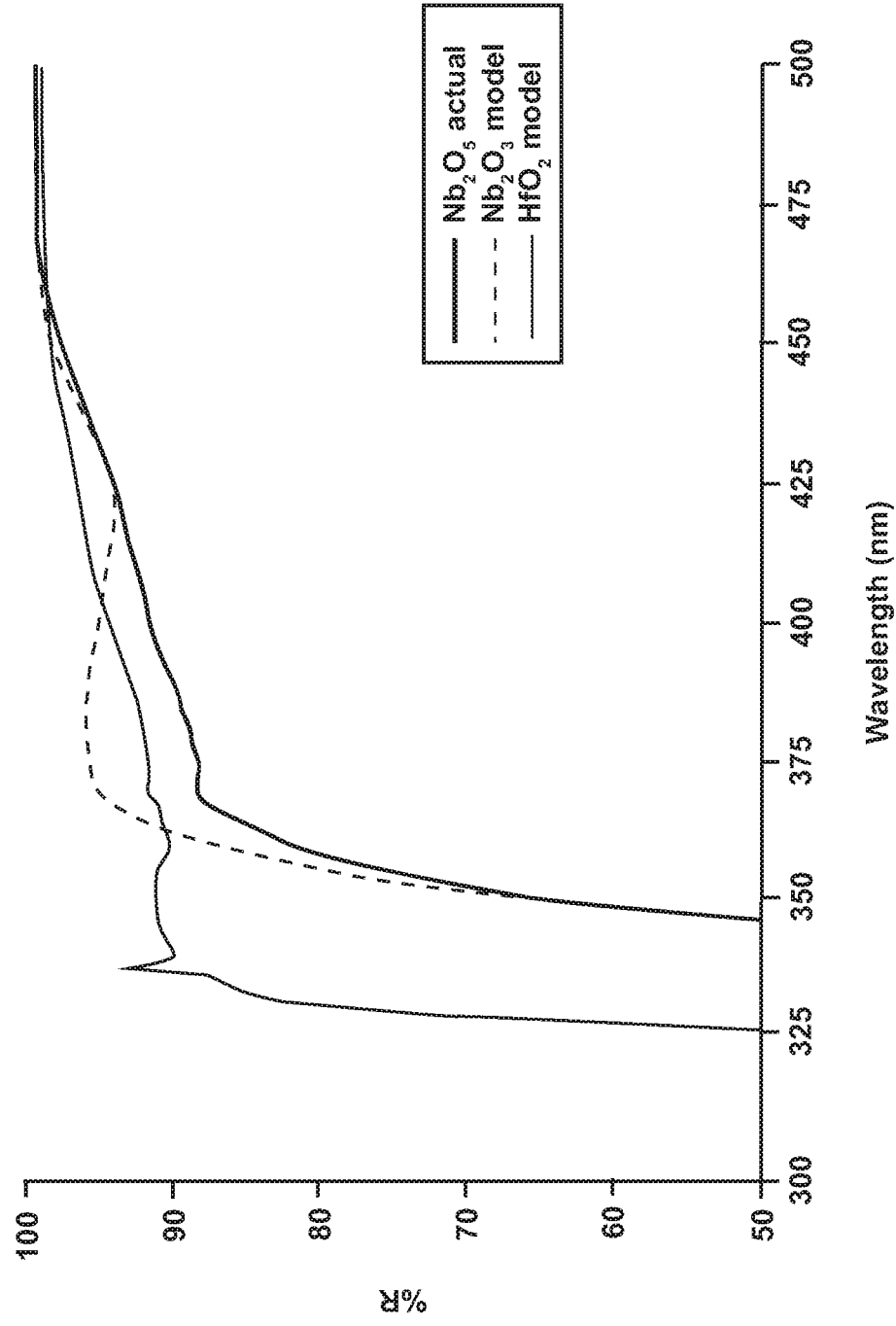
FIG. 8 is a graph of the wavelength versus percent reflectance demonstrating how the $HfO_2$ can increase the reflectivity band down to 325 nm.

FIG. 7 demonstrates the improved reflectivity of $HfO_2$ as one of the plurality of tuning layers 30 used in the highly reflective mirror 10. The use of $HfO_2$ as one of the tuning layers can replace other high index materials such as $Al_2O_3$, $SiO_2$, $Nb_2O_5$, $TiO_2$, and various fluorides since it has a low absorption in the NUV and extends the silver stack reflectivity compared to the other high index materials mentioned above. FIG. 8 shows how the $HfO_2$ can extend the LWIR band by greater than 15 nm compared to the $Nb_2O_5$ material.

Figure 10:
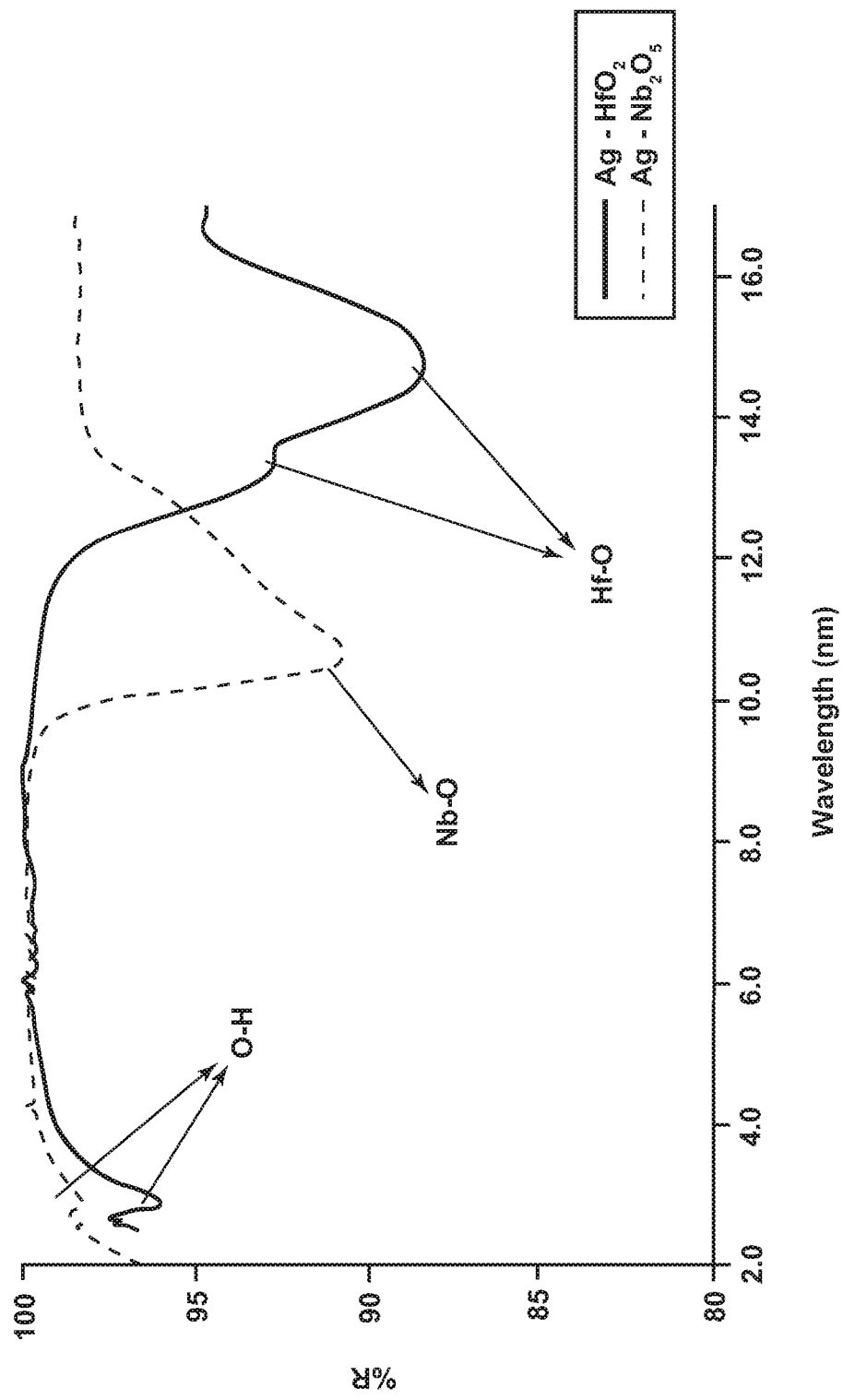
FIG. 10 is a graph of the wavelength versus percent reflectance absorption bands for $Nb_2O_5$ and $HfO_2$ single layer thin films on glass.

FIG. 10 demonstrates IR reflectance for a thin film layer of $HfO_2$ on silver and the IR reflectance for a thin film layer of $Nb_2O_5$ on silver, respectively. The plot points out the respective O—H stretch, Nb—O stretch, and the Hf—O stretch for the $HfO_2$ and $Nb_2O_5$ films respectively measured at an angle of 45°.

The plurality of tuning layers 30 and the protective layer 42 can also be combined into a single layer using a single material which is $Yb_xF_yO_z$. When only a single tuning/protective layer 42 is used, the thickness of the layer is in the range of 150 nm to 350 nm.

Materials that found to be useful as protective layers 42 are $YbF_3$, $YF_3$, and $Si_3N_4$. $YbF_3$ and $YF_3$ (low refractive index), $GdF_3$ (medium refractive index in VIS range), and ZnS and $Bi_2O_3$ (both high refractive index) are materials that can be used for tuning and that have minimum absorption in all bands including the LWIR. In addition, $Si_3N_4$ (medium refractive index), and $Nb_2O_5$, $TiO_2$ and $Ta_2O_5$ (all three high refractive index) can be used as a material for one or more of the plurality of tuning layers 30, but their LWIR absorption bands need to be considered in view of the application in which the mirror will be used. In some embodiments, the protective layer 42 comprises at least one material selected from the group consisting of $YbF_3$, $YF_3$, $Si_3N_4$, and combinations thereof. In other embodiments, the protective layer 42 consists essentially of at least one material selected from the group consisting of $YbF_3$, $YF_3$, $Si_3N_4$, and combinations thereof. In still other embodiments, the protective layer 42 consists of at least one material selected from the group consisting of $YbF_3$, $YF_3$, $Si_3N_4$, and combinations thereof. In some embodiments, the tuning layer 30 comprises at least one material selected from the group consisting of $YbF_3$, $YF_3$, $GdF_3$, ZnS, $Bi_2O_3$, $Nb_2O_5$, $TiO_2$, $Ta_2O_5$, $Yb_xF_yO_z$, and combinations thereof. In other embodiments, the tuning layer 30 consists essentially of at least one material selected from the group consisting of $YbF_3$, $YF_3$, $GdF_3$, ZnS, $Bi_2O_3$, $Nb_2O_5$, $TiO_2$, $Ta_2O_5$, $Yb_xF_yO_z$, and combinations thereof. In still other embodiments, the tuning layer 30 consists of at least one material selected from the group consisting of $YbF_3$, $YF_3$, $GdF_3$, ZnS, $Bi_2O_3$, $Nb_2O_5$, $TiO_2$, $Ta_2O_5$, $Yb_xF_yO_z$, and combinations thereof.

Method for Making the Highly Reflective Mirror

Silver can react with various substances that may be present in the atmosphere, for example salts, acids, and sulfur compounds. Well known examples include silver tarnishing, which is the formation of black silver sulfide ($Ag_2S$) by the reaction of $Ag^0$ with sulfur containing compounds, and silver corrosion, which results from the reaction of $Ag^0$ with halogen-containing substances in the atmosphere, the most common of which is probably NaCl and HCl (T. E. Graedel, Corrosion Mechanisms for Silver Exposed to the Atmosphere, J. Electrochemical Society Vol. 139, No. 7, pages 1963-1969 (1992), and D. Liang et al, Effects of Sodium Chloride Particles, Ozone, UV, and Relative Humidity on Atmospheric Corrosion of Silver, J. Electrochemical Society Vol. 157, No. 4, pages C146-C156 (2010)). Both corrosion and tarnishing can be accelerated by the presence of humidity and ozone in the atmosphere.

The Vickers hardness (HV) of silver is 100 HV (electro-deposited), which is low compared to the other end of the HV spectrum where diamond has a value of 10,000 HV. As a result of the relative softness of silver compared to other materials, the handling of a silver coated optics for system assembly, or cleaning the optics which include mirrors, will often result in damaging the silver surface. As a result, the protective layer 42 is needed to minimize damaging the silver surface. In order to be effective, the protective layer 42 must be (1) sufficiently dense such that no pathways are provided from the optic's surface to silver and interface layers, (2) insoluble in alkali and acidic environments, (3) mechanically hard to provide scratch resistance, and (4) have either (a) only minimal absorption throughout the entire wavelength range of interest, 0.300 μm to 15 μm in the present case, or (b) no absorption over the 0.300 μm to 15 μm wavelength range. Silicon nitride, $Si_3N_4$, was tested for its alkali diffusion properties, solubility in alkali solution and for its mechanical hardness properties, and was found to provide a very durable and chemically resistant coating. However, while this material was unfortunately found to have an absorption band at approximately 9.1 μm, this disclosure shown that if the $Si_3N_4$ is sufficiently thin it can be used. The exact thickness depends on the throughput of the system for the band range. For some applications this band is of no interest so the thickness is of limited consequence.

The barrier layer 46, the first interface layer 18, the second interface layer 26, the third interface layer 50, the fourth interface layer 58, the first reflective layer 22, the second reflective layer 54, and the plurality of tuning layers 30 can each, independently, be deposited using ion assistance. In some embodiments, ion assistance is not used or is used for only part of the deposition process. In all embodiments, the protective layer 42 is deposited using ion assistance. However, these materials can also be deposited using other processes and will perform well over the 0.300 μm to 15 μm wavelength range, with the provision that the process can be optimized for the desired characteristics. Ion assist deposition techniques, under the correct conditions, can optimize stoichiometry, density, and possibly structure. In some embodiments, different techniques can be used to prepare a mirror having the 0.300 μm to 15 μm wavelength range characteristics as described herein. The techniques selected were dependent on the materials being used and the desired properties to be achieved.

Process considerations for depositing the stack must be taken into consideration and these considerations are material and interface dependent. Because film density and stoichiometry are critical, ion beam bombardment is used during the deposition. Ion energies and densities must be adjusted appropriately so as to densify, but not damage the film. Gas ratios of Ar, $N_2$, $O_2$ can be adjusted to control the desired stoichiometry, with the warning that $O_2$ should either: (a) not be used during deposition of the Ag layer or the interface layer positioned above the first and/or second reflective layers afterwards, or (b) not be used at the beginning of the deposition of the interface layer positioned above the first and/or second reflective layers, but added into the deposition process after a very thin, 3-5 nm interface layer has been applied to the top of the Ag layer. The objective is to have the interface layer used above the first and/or second reflective layers, for example an oxide such as $Al_2O_3$, adhere to the first and/or second reflective layer while not exposing the first and/or second reflective layer surface to excessive $O_2$ before the $Al_2O_3$ deposition, while maintaining substantially all of the $Al_2O_3$ at a stoichiometric or near stoichiometric Al:O ratio. In some embodiments, the following process criteria may be used for the stack.

First, if $Al_2O_3$ is used as the barrier layer 46, then its initial partial pressures of Ar—$O_2$ gases must be adjusted to create the desired $Al_xO_y$ stoichiometry needed to optimize adhesion at the Al—$Al_xO_y$ interface. The $Al_xO_y$—Ag interface partial pressures are different than the Al—$Al_xO_y$ interface to achieve optimum adhesion so the process must be adjusted towards the end of this barrier layer 46. The $Al_xO_y$ stoichiometry needed for optimum adhesion at either the Al or Ag interfaces are discussed in the references 4 above. Their partial pressures or gas flow ratios will be dependent on deposition rates, pumping speeds and deposition volumes.

Second, stoichiometry is also critical at the oxide-fluoride interfaces to obtaining optimum adhesion. In the case of oxide material, terminating the layer so that it is a stoichiometric oxide is important; while the fluoride at the interface should be an oxyfluoride.

Third, there are considerations to take into account when using IAD during silver deposition; it is important not to exceed certain ion energies and densities because it can result in trapping Ar into the film. These defects can act as scattering centers which will reduce reflectivity at the lower visible wavelength bands.

Fourth, bombardment energies and gas ratios should be adjusted to obtain optimum film density. When densifying fluoride materials one has to consider ion energies that will not dissociate the fluorine atoms of the growing film. If this occurs, the film will become very unstable and spectral shifting will be observed.

Thus, in some aspects of the present disclosure, the process is directed to the highly reflective mirror 10 for use in the wavelength range of 0.300 µm to 15 µm. The highly reflective mirror 10 includes the substrate 14, the barrier layer 46 on the substrate 14, the first interface layer 18 on top of the barrier layer 46, the first reflective layer 22 on top of the first interface layer 18, the second interface layer 26 on top of the first reflective layer 22, the plurality of tuning layers 30 on top of the second interface layer 26, and at least one protective layer 42 on top of the plurality of tuning layers 30. The highly reflective mirror 10 may have a reflectivity of at least 90% over the wavelength ranges of 335 nm to 1000 nm at an AOI 45°. The mirror may have a reflectivity of at least 90% over the wavelength range of 340 nm to 400 nm at an AOI 45°. In some embodiments, the substrate 14 that can be used in making the highly reflective mirror 10 can be selected from the group consisting of fused silica, fluorine doped fused silica and diamond turned aluminum alloys. In some embodiments, the substrate 14 is 6061-Al alloy. In other embodiments, the substrate 14 is fused silica. In some embodiments, the barrier layer 46 is selected from the group consisting of $Si_3N_4$, $SiO_2$, TiAlN, TiAlSiN, $TiO_2$, DLC, and combinations thereof. In some embodiments, the first interface layer 18, second interface layer 26, third interface layer 50, and/or fourth interface layer 58 may be selected from the group consisting of $Al_2O_3$, $TiO_2$, $Bi_2O_3$, ZnS, and combinations thereof. In some embodiments, the first interface layer 18, second interface layer 26, third interface layer 50, and/or fourth interface layer 58 includes at least one material including $Al_2O_3$, $TiO_2$, $Bi_2O_3$, ZnS, Ni, Bi, Monel (Ni—Cu), Ti, Pt, or a combination thereof. In other embodiments, the first interface layer 18, second interface layer 26, third interface layer 50, and/or fourth interface layer 58 includes metallic materials selected from the group consisting of Ni, Bi, Monel (Ni—Cu), Ti, Pt, and combinations thereof. In still other embodiments, the first interface layer 18, second interface layer 26, third interface layer 50, and/or fourth interface layer 58 comprise at least one materials selected from the group consisting of $Al_2O_3$, $TiO_2$, $Bi_2O_3$, and ZnS, Ni, Bi, Monel Ti, Pt, and combinations thereof. In some embodiments, the first reflective layer 22 and/or second reflective layer 54 comprise, consist essentially of, or consist of at least one materials selected from the group consisting of zero valent Ag, Au, Al, Rh, Cu, Pt, and Ni. In some embodiments, the first interface layer 18, second interface layer 26, third interface layer 50, and/or fourth interface layer 58 comprise, consist essentially of, or consist of at least one material selected from the group consisting of $SiO_2$, $Si_3N_4$, $Nb_2O_5$, $TiO_2$, $Ta_2O_5$, $Bi_2O_3$, ZnS, and $Al_2O_3$. In some embodiments, the plurality of tuning layers 30 includes a combination of low index materials and the high index materials wherein the high index material is $HfO_2$ and the other materials comprise, consist essentially of, or consist of at least one material selected from the group consisting of $YbF_3$, $YF_3$, $GdF_3$, and $Bi_2O_3$. In some embodiments, the protective layer 42 is at least one material selected from the group consisting of $YbF_3$, $YF_3$, and $Si_3N_4$. Following the layering from the substrate 14 to the top protective layer 42, an exemplary highly reflective mirror 10 according to the present disclosure can include: fused silica, $Si_3N_4$ or CrN, $Al_2O_3$, Ag, $Al_2O_3$, $YbF_3$, $HfO_2$, and $YbF_3$.

Figure 11:
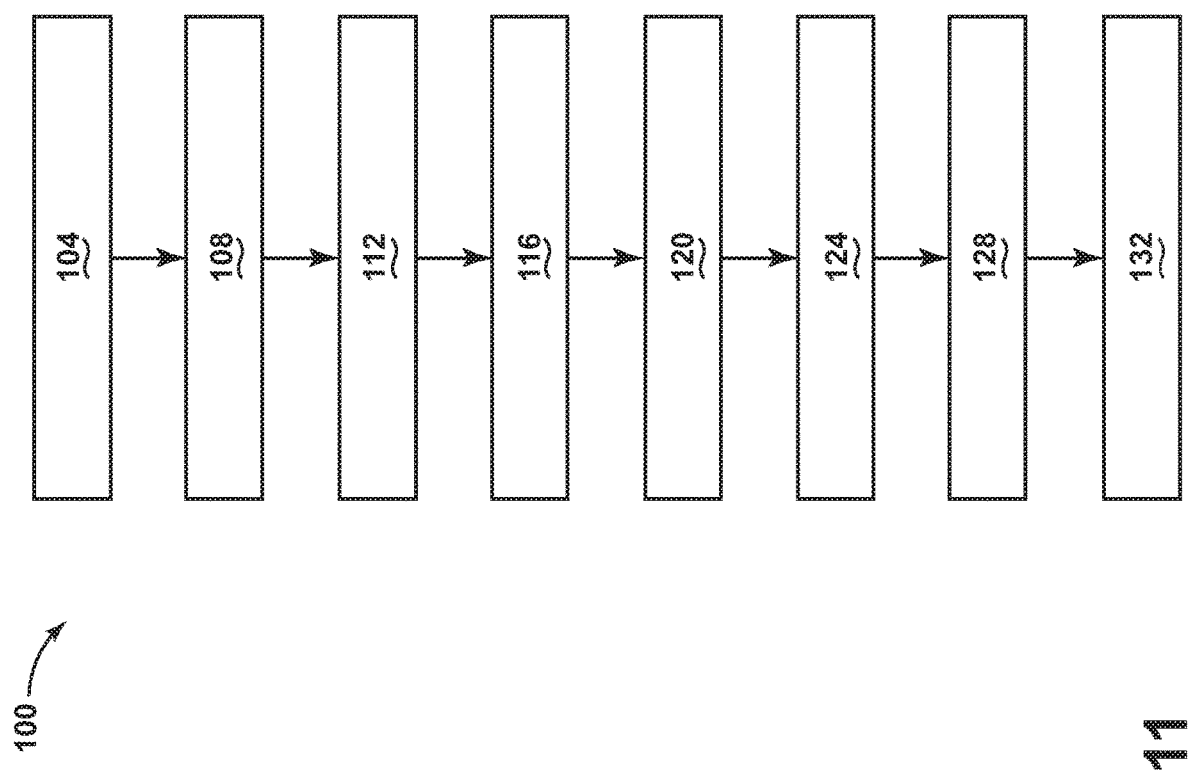
FIG. 11 is a flow diagram of a method for making a highly reflective mirror according to some embodiments of the present disclosure.

Referring now to FIG. 11, the present disclosure is also directed to a method 100 for making the highly reflective mirror 10 for use in the wavelength range of 0.300 µm to 15 µm, the method 100 comprising the steps of:

providing the substrate 14 selected from the group consisting of aluminum alloys, silica, fused silica, F-doped fused silica, magnesium alloys and titanium alloys (step 104);

polishing the substrate 14 to a roughness of less than 10 nm (step 108);

applying the barrier layer 46 having a thickness in the range of 10 nm to 100 µm to the surface of the substrate 14 (step 112);

applying the first interface layer 18 having a thickness in the range of 0.2 nm to 50 nm on top of the barrier layer 46, said thickness being dependent on the interface layer material (step 116);

applying the first reflecting layer 22 having a thickness in the range of 100 nm to 300 nm on top of the first interface layer 18 (step 120);

applying the second interface layer 26 having a thickness in the range of 0.2 nm to 50 nm on top of the first reflective layer 22 (step 124);

applying the plurality of tuning layers 30 including a combination of the low index material and the high index material wherein the high index material is $HfO_2$, the thickness of the plurality of tuning layers 30 being dependent on the low index and high index materials (step 128); and applying the protective layer 42 on top of the plurality of tuning layers 30 (step 132) to thereby form the highly reflective mirror 10 having a reflectivity of at least 90% over the wavelength range of 335 nm to 1000 nm at an AOI 45°.

In the foregoing method the barrier layer 46 material is selected from the group consisting of $Si_3N_4$, $SiO_2$, TiAlN, TiAlSiN, $TiO_2$, DLC, Al, and CrN; the first interface layer 18 material is selected from the group consisting of $Al_2O_3$, $TiO_2$, $Bi_2O_3$, ZnS, Ni, Monel (Ni—Cu), Ti, and Pt; the first reflective layer 22 and/or second reflective layer 54 is at least one material selected from the group consisting of Ag, Au, Al, Rh, Cu, Pt, and Ni; the second interface layer 26 is at least one material selected from the group consisting of $SiO_2$, $Si_3N_4$, $Nb_2O_5$, $TiO_2$, $Ta_2O_5$, and $Al_2O_3$; the plurality of tuning layers 30 includes the high index material of $HfO_2$ and one or more additional materials selected from the group consisting of $YbF_3$, $YF_3$, $GdF_3$, and $Bi_2O_3$; and the protective layer 42 is selected from the group consisting of $YbF_3$, $YF_3$, and $Si_3N_4$. In some embodiments, the first reflective layer 22 and/or second reflective layer 54 is silver.

It is understood that the descriptions outlining and teaching the barrier layer 46, the first interface layer 18, the second interface layer 26, the third interface layer 50, the fourth interface layer 58, the first reflective layer 22, the second reflective layer 54, the plurality of tuning layers 30, and the protective layer 42 previously discussed, which can be used in any combination, can be applied to the method 100 for making the highly reflective mirror 10 for use in the wavelength range of 0.300 μm to 15 μm.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

It will be apparent to those skilled in the art that various modifications and variations can be made without departing from the spirit or scope of the claims.

EXAMPLES

Example 1

Figure 9A:
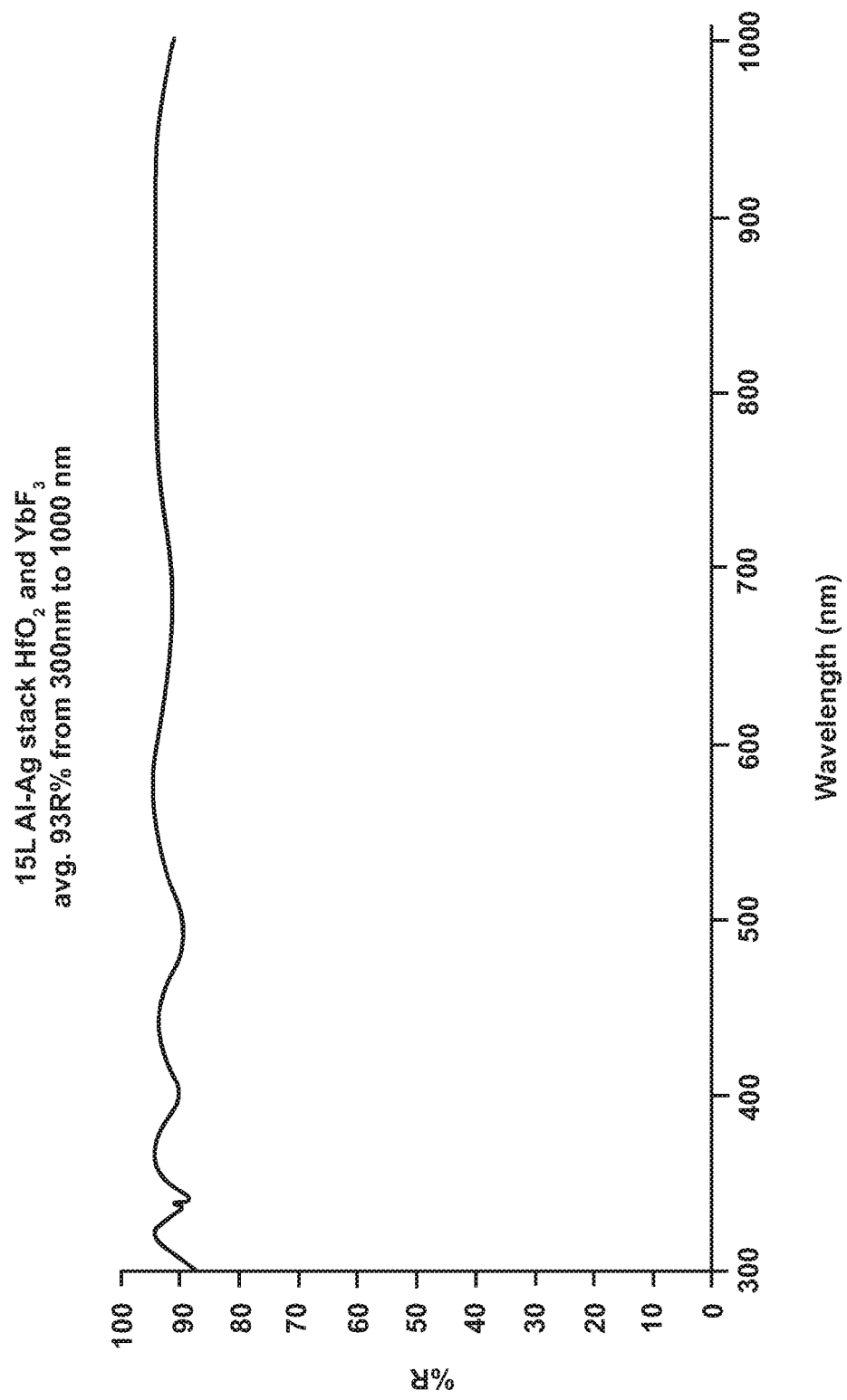
FIG. 9A is a graph of the wavelength versus percent reflectance for a Al—Ag stack with a $HfO_2$—$YbF_3$ tuning layer having an average reflectivity of greater than 92% from 300 nm to 1000 nm.
Figure 9B:
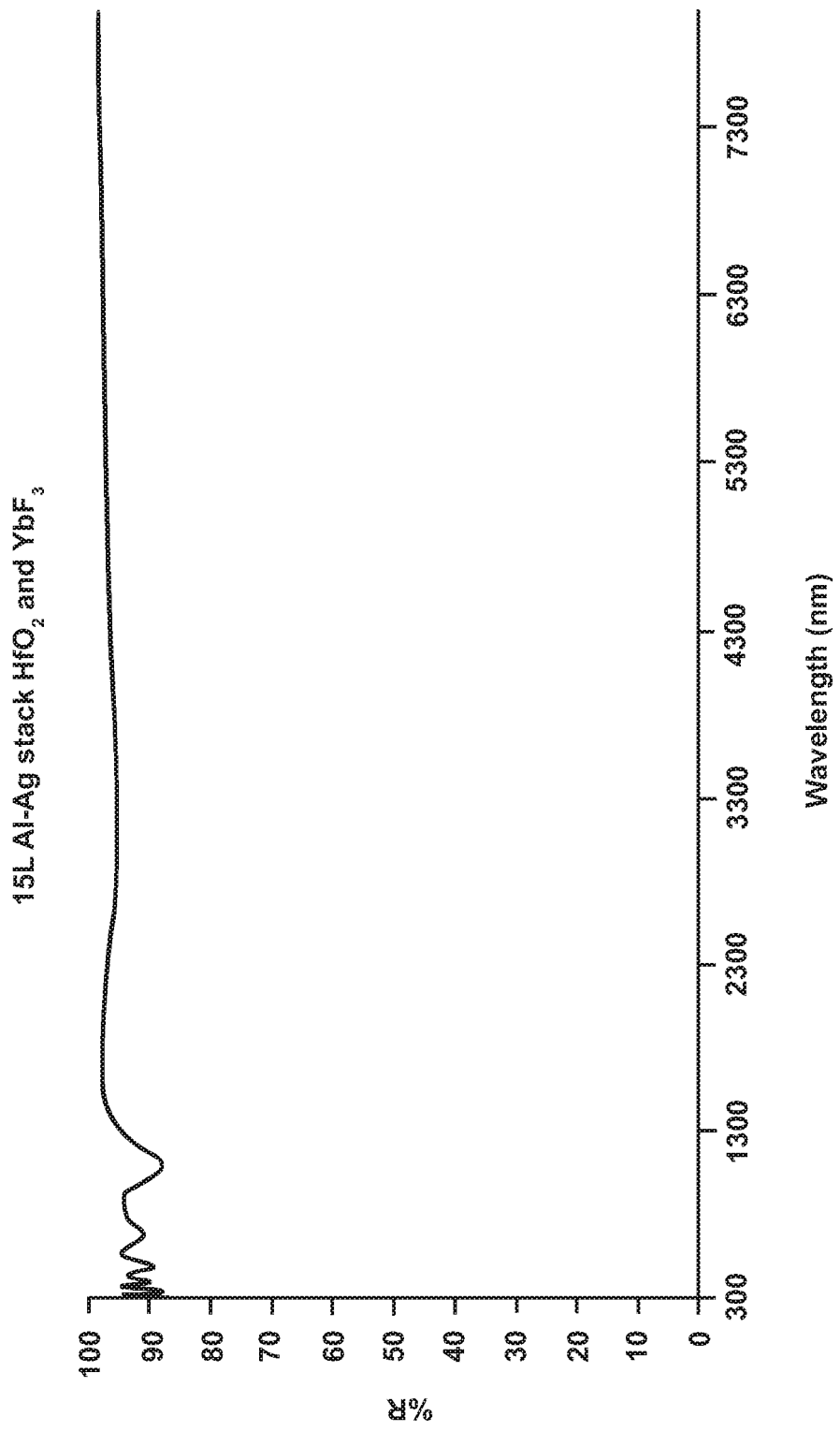
FIG. 9B is a graph of the wavelength versus percent reflectance for a Al—Ag stack with a $HfO_2$—$YbF_3$ tuning layer having an average reflectivity of greater than 92% from 300 nm to 8000 nm.

As shown in FIG. 3, the substrate 14 may be coupled on its top side to the first reflective layer 22a, the first reflective layer 22a may be coupled on its top side to the first interface layer 18b, the first interface layer 18b may be coupled on its top side to the second interface layer 26b, the second interface layer 26b may be coupled on its top side to the second reflective layer 54, the second reflective layer 54 may be coupled on its top side to the third interface layer 50a, the third interface layer 50a may be coupled on its top side to the plurality of tuning layers 30, and the plurality of tuning layers 30 may be coupled on the top side of its top layer to the protective layer 42. FIGS. 9A-9B are graphs showing the wavelength versus percent reflectance for a Al—Ag stack with a $HfO_2$—$YbF_3$ tuning layer having an average reflectivity of greater than 92% from 300 nm to 1000 nm, and the wavelength versus percent reflectance for a Al—Ag stack with a $HfO_2$—$YbF_3$ tuning layer having an average reflectivity of greater than 92% from 300 nm to 8000 nm, respectively.

TABLE 2

An example stack used as the highly reflective mirror according to FIG. 3

| | | Thickness |
|---|---|---|
| Protective Layer | YbFO | 83.76 nm |
| Plurality of Tuning Layers | $HfO_2$ | 43.31 nm |
| | YbFO | 24.36 nm |
| | $HfO_2$ | 34.74 nm |
| | YbFO | 53.47 nm |
| | $Al_2O_3$ | 45.45 nm |
| | YbFO | 51.72 nm |
| | $HfO_2$ | 36.24 nm |
| | YbFO | 32.68 nm |
| | $HfO_2$ | 38.82 nm |
| Third Interface Layer | $Al_2O_3$ | 30 nm |

TABLE 2-continued

An example stack used as the highly reflective mirror according to FIG. 3

| | | Thickness |
|---|---|---|
| Second Reflective Layer | Ag | 10 nm |
| Second Interface Layer | $Al_2O_3$ | 10 nm |
| First Interface Layer | $YbF_3$ | 5 nm |
| First Reflective Layer | Al | 200 nm |
| Substrate | Fused Silica | 619 nm |

Prophetic Example 1

In some embodiments, the substrate 14 may be coupled on its top side to the barrier layer 46, the barrier layer 46 may be coupled on its top side to the first interface layer 18, the first interface layer 18 may be coupled on its top side to the first reflective layer 22, the first reflective layer 22 may be coupled on its top side to the second interface layer 26, the second interface layer 26 may be coupled on its top side to the plurality of tuning layers 30, and the plurality of tuning layers 30 may be coupled on the top side of its top layer to the protective layer 42.

TABLE 3

An example stack used as the highly reflective mirror according to FIG. 1

| | | Thickness |
|---|---|---|
| Protective layer | YbFO | 50-100 nm |
| Plurality of Tuning Layers | $HfO_2$ | 20-60 nm |
| | YbFO | 20-60 nm |
| | $HfO_2$ | 20-60 nm |
| Second Interface Layer | $Al_2O_3$ | 20-40 nm |
| First Reflective Layer | Ag | 1-30 nm |
| First Interface Layer | $Al_2O_3$ | 1-15 nm |
| Barrier Layer | $Si_3N_4$ or CrN | 10-500 nm |
| Substrate | Fused Silica | 500-750 nm |

Prophetic Example 2

In some embodiments, the substrate 14 may be coupled on its top side to the barrier layer 46, the barrier layer 46 may be coupled on its top side to the first interface layer 18a, the first interface layer 18a may be coupled on its top side to the first reflective layer 22a, the first reflective layer may be coupled on its top side to the second interface layer 26a, the second interface layer 26a may be coupled on its top side to a third interface layer 50, the third interface layer 50 may be coupled on its top side to a second reflective layer 54, the second reflective layer may be coupled on its top side to a fourth interface layer 58, the fourth interface layer 58 may be coupled on its top side to the plurality of tuning layers 30, and the plurality of tuning layers 30 may be coupled on the top side of its top layer to the protective layer 42.

TABLE 4

An example stack used as the highly reflective mirror according to FIG. 2

| | | Thickness |
|---|---|---|
| Protective Layer | YbFO | 50-100 nm |
| Plurality of Tuning Layers | $HfO_2$ | 20-60 nm |
| | YbFO | 20-60 nm |

TABLE 4-continued

An example stack used as the highly reflective mirror according to FIG. 2

|  |  | Thickness |
|---|---|---|
|  | HfO$_2$ | 20-60 nm |
| Fourth Interface Layer | Al$_2$O$_3$ | 20-40 nm |
| Second Reflective Layer | Ag | 1-30 nm |
| Third Interface Layer | Al$_2$O$_3$ | 1-15 nm |
| Second Interface Layer | YbF$_3$ | 1-15 nm |
| First Reflective Layer | Al | 1-250 nm |
| First Interface Layer | YbF$_3$ | 1-15 nm |
| Barrier Layer | Nb$_2$O$_5$ | 10-100 nm |
|  | YbF$_x$O$_y$ | 10-100 nm |
|  | Nb$_2$O$_5$ | 10-100 nm |
|  | YbF$_x$O$_y$ | 10-100 nm |
|  | Nb$_2$O$_5$ | 10-100 nm |
|  | YbF$_x$O$_y$ | 10-100 nm |
|  | Nb$_2$O$_5$ | 10-100 nm |
| Substrate | Al | 50-200 nm |
|  | 6061-Al | 500-750 nm |

Prophetic Example 3

In some embodiments, the substrate 14 may be coupled on its top side to the first reflective layer 22a, the first reflective layer 22a may be coupled on its top side to the barrier layer 46, the barrier layer 46 may be coupled on its top side to the first interface layer 18c, the first interface layer 18c may be coupled on its top side to the second reflective layer 54, the second reflective layer 54 may be coupled on its top side to the second interface layer 26c, the second interface layer 26c may be coupled on its top side to the plurality of tuning layers 30, and the plurality of tuning layers 30 may be coupled on the top side of its top layer to the protective layer 42.

TABLE 5

An example stack used as the highly reflective mirror according to FIG. 4

|  |  | Thickness |
|---|---|---|
| Protective Layer | YbFO | 50-100 nm |
| Tuning Layers | HfO$_2$ | 20-60 nm |
|  | YbFO | 20-60 nm |
|  | HfO$_2$ | 20-60 nm |
| Third Interface Layer | Al$_2$O$_3$ | 20-40 nm |
| Second Reflective Layer | Ag | 1-30 nm |
| Second Interface Layer | Al$_2$O$_3$ | 1-15 nm |
| Barrier Layer | Nb$_2$O$_5$ | 10-100 nm |
|  | YbF$_x$O$_y$ | 10-100 nm |
|  | Nb$_2$O$_5$ | 10-100 nm |
|  | YbF$_x$O$_y$ | 10-100 nm |
|  | Nb$_2$O$_5$ | 10-100 nm |
| First Reflective Layer | Al | 50-400 nm |
| Substrate | 6061-Al | 500-750 nm |

LIST OF NON-LIMITING EMBODIMENTS

Embodiment A is a highly reflective mirror for use in the wavelength range of 0.300 µm to 15 µm, the highly reflective mirror comprising: a substrate; a first interface layer; a reflective layer; a second interface layer; a plurality of tuning layers comprising a combination of a low index material and a high index material, wherein the high index material comprises HfO$_2$; and a protective layer. The highly reflective mirror has a reflectivity of at least 90% over the wavelength range of 335 nm to 1000 nm at an AOI 45°.

The highly reflective mirror of Embodiment A wherein the highly reflective mirror has a reflectivity of at least 90% over the wavelength range of 340 nm to 400 nm at an AOI 45°.

The highly reflective mirror of Embodiment A or Embodiment A with any of the intervening features further comprising a barrier layer wherein the barrier layer comprises a corrosion resistant layer, an abrasion resistant layer, a stress tuning layer, or a combination thereof.

The highly reflective mirror of Embodiment A or Embodiment A with any of the intervening features wherein the barrier layer is the corrosion resistant layer comprising Si$_3$N$_4$, SiO$_x$N$_y$, SiO$_2$, CrN, NiCrN, Cr, NiCr, Ni, diamond like carbon (DLC), or a combination thereof.

The highly reflective mirror of Embodiment A or Embodiment A with any of the intervening features wherein the barrier layer is the abrasion resistant layer comprising Si$_3$N$_4$, SiO$_2$, SiO$_x$N$_y$, AlO$_x$N$_y$, AlN, YbF$_3$, YbF$_x$O$_y$, diamond like carbon (DLC), or a combination thereof.

The highly reflective mirror of Embodiment A or Embodiment A with any of the intervening features wherein the barrier layer is the stress tuning layer comprising Si$_3$N$_4$, SiO$_2$, SiO$_x$N$_y$, Nb$_2$O$_5$, Ta$_2$O$_5$, TiO$_2$, fluorides, metals, metal oxides, or a combination thereof.

The highly reflective mirror of Embodiment A or Embodiment A with any of the intervening features wherein the substrate comprises a fused silica, a silica, a F-doped fused silica, a 6061-Al alloy, an aluminum alloy, a magnesium alloy, a titanium alloy, or a combination thereof.

The highly reflective mirror of Embodiment A or Embodiment A with any of the intervening features wherein the low index material comprises YbFO and the high index material comprises HfO$_2$.

The highly reflective mirror of Embodiment A or Embodiment A with any of the intervening features wherein the barrier layer has a thickness from about 10 nm to about 50 µm.

The highly reflective mirror of Embodiment A or Embodiment A with any of the intervening features wherein the first interface layer has a thickness from 0.2 nm to 50 nm and comprises Al$_2$O$_3$, TiO$_2$, ZnS, MgF$_2$, AlF$_3$, Ni, Monel (Ni—Cu), Ti, Pt, or a combination thereof.

The highly reflective mirror of Embodiment A or Embodiment A with any of the intervening features wherein the second interface layer comprises Nb$_2$O$_5$, TiO$_2$, Ta$_2$O$_5$, Bi$_2$O$_3$, ZnS, Al$_2$O$_3$, or a combination thereof and the thickness of the second interface layer is in the range of 0.2 nm to 50 nm.

The highly reflective mirror of Embodiment A or Embodiment A with any of the intervening features wherein the low index material has a thickness from 5 nm to 75 nm and the high index material has a thickness from 5 nm to 75 nm.

The highly reflective mirror of Embodiment A or Embodiment A with any of the intervening features wherein the low index material has a thickness from 25 nm to 60 nm and the high index material has a thickness from 25 nm to 60 nm.

Embodiment B is a method for making a highly reflective mirror for use in the wavelength range of 0.300 µm to 15 µm, the method comprising the steps of: providing a substrate; polishing the substrate to a roughness of less than 10 nm; applying a first interface layer having a thickness in the range of 0.2 nm to 25 nm on top of the barrier layer, the thickness being dependent on the first interface layer; applying a reflective layer having a thickness in the range of 75 nm to 300 nm on top of the first interface layer; applying a second interface layer having a thickness in the range of 5 nm to 20 nm, the thickness being dependent on the first interface layer; applying a plurality of tuning layers comprising a combination of a low index material and a high index material wherein the high index material is $HfO_2$, the thickness of the tuning layers being dependent on the low index and high index materials; and applying a protective layer on top of the tuning layer.

The method of Embodiment B further comprising applying a barrier layer having a thickness in the range of 10 nm to 50 μm to the surface of the substrate.

The method of Embodiment B or Embodiment B with any of the intervening features wherein the barrier layer comprises a corrosion resistant layer, an abrasion resistant layer, a stress tuning layer, or a combination thereof.

The method of Embodiment B or Embodiment B with any of the intervening features wherein the barrier layer is the corrosion resistant layer comprising $Si_3N_4$, $SiO_xN_y$, $SiO_2$, CrN, NiCrN, Cr, NiCr, Ni, diamond like carbon (DLC), or a combination thereof.

The method of Embodiment B or Embodiment B with any of the intervening features wherein the barrier layer is the abrasion resistant layer comprising $Si_3N_4$, $SiO_xN_y$, $SiO_2$, $AlO_xN_y$, AlN, $YbF_3$, $YbF_xO_y$, diamond like carbon (DLC), or a combination thereof.

The method of Embodiment B or Embodiment B with any of the intervening features wherein the barrier layer is the stress tuning layer comprising $Si_3N_4$, $SiO_xN_y$, $SiO_2$, $Nb_2O_5$, fluorides, and metals.

The method of Embodiment B or Embodiment B with any of the intervening features wherein the low index material has a thickness from 5 nm to 75 nm and the high index material has a thickness from 5 nm to 75 nm.

What is claimed is:

1. A highly reflective mirror for use in a wavelength range of 0.300 μm to 15 μm, the highly reflective mirror comprising:
    a substrate;
    a barrier layer comprising an abrasion resistant layer and a stress tuning layer;
    a first interface layer;
    a reflective layer;
    a second interface layer;
    a plurality of tuning layers comprising at least a first layer and a second layer, the first layer comprising a low refractive index material and the second layer comprising a high refractive index material, the high refractive index material comprising $HfO_2$, and wherein the second layer has a thickness in a range of 20 nm to 60 nm and a total thickness of the plurality of tuning layers is in a range of 60 nm to 360 nm; and
    a protective layer,
    wherein the highly reflective mirror has a reflectivity of at least 90% over a wavelength range of 335 nm to 1000 nm at an angle of incidence (AOI) of 45°.

2. The highly reflective mirror of claim 1, wherein the highly reflective mirror has a reflectivity of at least 90% over a wavelength range of 340 nm to 400 nm at an AOI of 45°.

3. The highly reflective mirror of claim 1, wherein the barrier layer further comprises a corrosion resistant layer that comprises $Si_3N_4$, $SiO_xN_y$, $SiO_2$, CrN, NiCrN, Cr, NiCr, Ni, diamond like carbon (DLC), or a combination thereof.

4. The highly reflective mirror of claim 1, wherein the abrasion resistant layer comprises $Si_3N_4$, $SiO_xN_y$, $SiO_2$, $AlO_xN_y$, AlN, $YbF_3$, $YbF_xO_y$, diamond like carbon (DLC), or a combination thereof.

5. The highly reflective mirror of claim 1, wherein the stress tuning layer comprises $Si_3N_4$, $SiO_xN_y$, $SiO_2$, $Nb_2O_5$, $Ta_2O_5$, $TiO_2$, fluorides, metals, metal oxides, or a combination thereof.

6. The highly reflective mirror of claim 1, wherein the substrate comprises a fused silica, a silica, a F-doped fused silica, a 6061-Al alloy, an aluminum alloy, a magnesium alloy, a titanium alloy, or a combination thereof.

7. The highly reflective mirror of claim 1, wherein the low index material comprises YbFO.

8. The highly reflective mirror of claim 1, wherein the barrier layer has a thickness from about 10 nm to about 50 μm.

9. The highly reflective mirror of claim 1, wherein the first interface layer has a thickness from 0.2 nm to 50 nm and comprises $Al_2O_3$, $TiO_2$, $Bi_2O_3$, ZnS, $MgF_2$, $AlF_3$, Ni, Monel (Ni-Cu), Ti, Pt, or a combination thereof.

10. The highly reflective mirror of claim 1, wherein the second interface layer has a thickness from 0.2 nm to 50 nm and comprises $Nb_2O_5$, $TiO_2$, $Ta_2O_5$, $Bi_2O_3$, ZnS, $Al_2O_3$, or a combination thereof.

11. The highly reflective mirror of claim 1, wherein the first layer a thickness from 25 nm to 60 nm and the second layer has a thickness from 25 nm to 60 nm.

12. The highly reflective mirror of claim 1, wherein the abrasion resistant layer includes $YbF_xO_y$.

13. The highly reflective mirror of claim 1, wherein the stress tuning layer includes $Nb_2O_5$.

14. The highly reflective mirror of claim 1, wherein the abrasion resistant layer includes $YbF_xO_y$ and the stress tuning layer includes $Nb_2O_5$.

15. The highly reflective mirror of claim 1, wherein the total thickness of the plurality of tuning layers is in a range of 75 nm to 300 nm.

16. A method for making a highly reflective mirror for use in a wavelength range of 0.300 μm to 15 μm, the method comprising the steps of:
    providing a substrate;
    polishing the substrate to a roughness of less than 10 nm;
    applying a barrier layer on top of the substrate, the barrier layer comprising an abrasion resistant layer and a stress tuning layer;
    applying a first interface layer having a thickness in a range of 0.2 nm to 25 nm on top of the barrier layer;
    applying a reflective layer having a thickness in a range of 75 nm to 300 nm on top of the first interface layer;
    applying a second interface layer having a thickness in a range of 5 nm to 20 nm;
    applying a plurality of tuning layer comprising at least a first layer and a second layer, the first layer comprising a low refractive index material and the second layer comprising a high refractive index material, the high refractive index material comprising $HfO_2$, and wherein the second layer has a thickness in a range of 20 nm to 60 nm and a total thickness of the plurality of tuning layers is in a range of 60 nm to 360 nm; and
    applying a protective layer on top of the plurality of tuning layers.

17. The method according to claim 16, wherein the barrier layer further comprises a corrosion resistant layer that comprises $Si_3N_4$, $SiO_xN_y$, $SiO_2$, CrN, NiCrN, Cr, NiCr, Ni, diamond like carbon (DLC), or a combination thereof.

18. The method according to claim 14, wherein the abrasion resistant layer comprises $Si_3N_4$, $SiO_xN_y$, $SiO_2$, $AlO_cN_y$, AlN, $YbF_3$, $YbF_xO_y$, diamond like carbon (DLC), or a combination thereof.

19. The method according to claim 16, wherein the stress tuning layer comprises $Si_3N_4$, $SiO_xN_y$, $SiO_2$, $Nb_2O_5$, fluorides, metals, or a combination thereof.

20. The method according to claim 14, wherein the first layer a thickness from 5 nm to 75 nm.

* * * * *

UNITED STATES PATENT AND TRADEMARK OFFICE
CERTIFICATE OF CORRECTION

| | | |
|---|---|---|
| PATENT NO. | : 11,143,800 B2 | Page 1 of 1 |
| APPLICATION NO. | : 16/001280 | |
| DATED | : October 12, 2021 | |
| INVENTOR(S) | : Jason Scott Ballou et al. | |

It is certified that error appears in the above-identified patent and that said Letters Patent is hereby corrected as shown below:

On the Title Page

In Column 1, item (54), Title, Line 2, delete "BANDWITH" and insert -- BANDWIDTH --, therefor.

On page 2, in Column 2, item (56), Other Publications, Line 4, delete "Evaoprated" and insert -- Evaporated --, therefor.

In the Specification

In Column 1, Line 2, delete "BANDWITH" and insert -- BANDWIDTH --, therefor.

In the Claims

In Column 24, Line 21, Claim 10, delete "A1$_2$O$_3$," and insert -- Al$_2$O$_3$, --, therefor.

In Column 24, Line 24, Claim 11, after "layer" insert -- has --.

In Column 24, Line 50, Claim 16, delete "layer" and insert -- layers --, therefor.

In Column 24, Line 64, Claim 18, delete "14," and insert -- 16, --, therefor.

In Column 24, Line 66, Claim 18, delete "AlO$_c$N$_y$," and insert -- AlO$_x$N$_y$, --, therefor.

In Column 25, Line 4, Claim 20, delete "14," and insert -- 16, --, therefor.

In Column 25, Line 5, Claim 20, after "layer" insert -- has --.

Signed and Sealed this
First Day of March, 2022

Drew Hirshfeld
*Performing the Functions and Duties of the*
*Under Secretary of Commerce for Intellectual Property and*
*Director of the United States Patent and Trademark Office*